United States Patent [19]
Tsukikawa

[11] Patent Number: 5,982,705
[45] Date of Patent: Nov. 9, 1999

[54] SEMICONDUCTOR MEMORY DEVICE PERMITTING LARGE OUTPUT CURRENT FROM OUTPUT BUFFER

[75] Inventor: Yasuhiko Tsukikawa, Hyogo, Japan

[73] Assignee: Mitsubishi Denki Kabushiki Kaisha, Tokyo, Japan

[21] Appl. No.: 09/045,834

[22] Filed: Mar. 23, 1998

[30] Foreign Application Priority Data

Oct. 7, 1997 [JP] Japan ..................................... 9-274437

[51] Int. Cl.⁶ ........................................................ G11C 8/00
[52] U.S. Cl. .............................. 365/230.08; 365/189.05; 365/189.11; 365/227
[58] Field of Search ..................... 365/230.08, 189.05, 365/227, 189.11, 191; 327/530, 533; 307/578; 326/83

[56] References Cited

U.S. PATENT DOCUMENTS

| | | | |
|---|---|---|---|
| 4,707,625 | 11/1987 | Yanagisawa | 307/578 |
| 5,543,734 | 8/1996 | Volk et al. | 326/83 |
| 5,559,464 | 9/1996 | Orii et al. | 327/333 |
| 5,847,595 | 12/1998 | Kono et al. | 327/530 |

FOREIGN PATENT DOCUMENTS

| | | |
|---|---|---|
| 5-347386 | 12/1993 | Japan . |
| 9-139077 | 5/1997 | Japan . |

*Primary Examiner*—David Nelms
*Assistant Examiner*—Thong Le
*Attorney, Agent, or Firm*—McDermott, Will & Emery

[57] ABSTRACT

An output transistor in an output buffer in a semiconductor memory device is formed in a well region which is electrically isolated from the substrate by a triple well structure. When the output transistor conducts, the potential of the well in which the output transistor is formed is controlled to follow the source potential of the output transistor, so that the increase in the threshold voltage caused by a substrate biasing effect can be prevented, and larger output current results.

17 Claims, 17 Drawing Sheets

SEMICONDUCTOR MEMORY DEVICE PERMITTING LARGE OUTPUT CURRENT FROM OUTPUT BUFFER

BACKGROUND OF THE INVENTION

1. Field of the Invention

The present invention relates generally to semiconductor memory devices, and more particularly, to a semiconductor memory devices including an output buffer circuit which outputs a signal corresponding to storage data.

2. Description of the Background Art

As semiconductor memory devices capable of operating at higher speeds have been developed, there is a need to increase the driving capability of an output buffer circuit in such a semiconductor memory device.

FIG. 14 is a circuit diagram of a first example of the basic configuration of an output buffer circuit for use in a conventional semiconductor memory device.

The output buffer circuit shown in FIG. 14 includes an output terminal OUT, a level changing circuit 220 which receives a first internal control signal HOUT generated based on storage data to output, and changes its "H" level from the level of an internal lowered potential Vcc lowered from an external power supply potential Vdd to the level of an internal boosted potential Vpp produced in the semiconductor device, inverters 216 and 218 connected in series to receive the output of level changing circuit 220, an N channel MOS transistor 210 coupled between external power supply potential Vdd and output terminal OUT to receive the output of inverter 218 at its gate, and an N channel MOS transistor 212 coupled between output terminal OUT and a ground potential Vss to receive a second internal control signal LOUT generated based on storage data to output at its gate.

Level changing circuit 220 includes an N channel MOS transistor 206 which receives first internal control signal HOUT at its gate, an inverter 214 which receives and inverts first internal control signal HOUT, and an N channel MOS transistor 208 which receives the output of inverter 214 at its gate.

The sources of N channel MOS transistors 206 and 208 are both coupled to ground potential Vss.

Level changing circuit 220 further includes a P channel MOS transistor 202 coupled between internal boosted potential Vpp and the drain of N channel MOS transistor 206 to receive the potential of the drain of N channel MOS transistor 208 at its gate, and a P channel MOS transistor 204 coupled between internal boosted potential Vpp and the drain of N channel MOS transistor 208 to receive the potential of the drain of N channel MOS transistor 206 at its gate.

Level changing circuit 220 outputs, to inverter 216, an output signal from a node N102 to which the drain of N channel MOS transistor 208 is connected, in other words, outputs a signal which is in phase with first internal control signal HOUT and attains the level of internal boosted potential Vpp at its "H" level.

The configurations of N channel MOS transistors 210 and 212 serving as output transistors in the conventional output buffer circuit shown in FIG. 14 will be now described.

FIG. 15 is a diagram for use in illustration of cross sections of output transistors 210 and 212 in the conventional output buffer circuit in FIG. 14.

Referring to FIG. 15, a first P well region 266 and a second P well region 268 are formed on a main surface of a P type silicon substrate 270 in the conventional semiconductor memory device, and N channel MOS transistors 212 and 210 are formed in the first and second P well regions 266 and 268, respectively.

N channel MOS transistor 212 includes N type impurity regions, i.e., a source 252 and a drain 256 and a gate electrode 254. N channel MOS transistor 210 includes N type impurity regions, i.e., a source 258 and a drain 262 and a gate electrode 260.

In the Dynamic Random Access Memory (hereinafter simply referred to as "DRAM"), the P type silicon substrate is normally provided with a potential lower than a ground potential. In FIG. 15, a P type impurity region 264 is formed on the main surface of P type silicon substrate 270, and P type silicon substrate 270 is provided with a negative potential Vbb through P type impurity region 264.

It is quite significant in the DRAM to thus provide a negative voltage to the P type silicon substrate in order to prevent charges from coming into the substrate at the time of the undershoot of an input signal, thereby to prevent data destruction of data in a memory cell, and to reduce a PN junction capacitance to be the floating capacitance of a bit line for the purpose of increasing the operation speed of the circuit.

FIG. 16 is an operation waveform chart for use in illustration of the operation of the output buffer circuit shown in FIG. 14.

Referring to FIGS. 14 and 16, let us now assume that second internal control signal LOUT is in an "L" state, wherein N channel MOS transistor 212 is in a non-conductive state.

If the level of output terminal OUT is initially 0V, first internal control signal HOUT is at an "L" level at time t1, and N channel MOS transistor 206 is in a non-conductive state.

Inverter 214 applies the inverse of first internal control signal HOUT to the gate of N channel MOS transistor 208, which then attains a conductive state, and node N102 attains an "L" level.

P channel MOS transistor 202, upon receiving the potential of node N102 at its gate, conducts and applies boosted potential Vpp to the gate of P channel MOS transistor 204. As a result, P channel MOS transistor 204 attains a non-conductive state, and the potential of node N102, in other words the level of the output of the level changing circuit is determined at an "L" level. As a result, the gate potential VG of N channel MOS transistor 210 attains an "L" level by the function of the series-connection of inverters 216 and 218.

As first internal control signal HOUT rises from 0V to internal lowered potential Vcc at time t2, N channel MOS transistor 206 conducts accordingly, while first internal control signal HOUT is inverted by inverter 214, and N channel MOS transistor 208 receiving the inverse at its gate attains a non-conductive state. Therefore, an "L level is applied to the gate of P channel MOS transistor 204 through N channel MOS transistor 206 which turns on P channel MOS transistor 204, and the potential of node N102 is raised to internal boosted potential Vpp.

P channel MOS transistor 202 attains a non-conductive state, because its gate potential, in other words, the potential of node N102 attains an "H" level. As a result, the output of level changing circuit 220, in other words the potential of node N102 is determined at the level of internal boosted potential Vpp, and the "H" level of first internal control signal HOUT is changed from the level of internal lowered potential Vcc to the level of internal boosted potential Vpp. The potential is transmitted through inverters 216 and 218, which raises the gate potential VG of N channel MOS transistor 210 from 0V to internal boosted potential Vpp. N channel MOS transistor 210 conducts accordingly, and starts raising the potential of output terminal OUT.

At time t3, a load capacitance connected with output terminal OUT outside the semiconductor memory device is sufficiently charged, and the potential of output terminal OUT is stabilized.

Herein, the current from the semiconductor memory device which charges the externally connected load capacitance through output terminal OUT is supplied by N channel MOS transistor 210 and given by the following expression:

$$IDS = K'(Vgs - Vth)^2 \quad (1)$$

wherein Vgs is a gate-source potential difference, Vth a threshold voltage, and K' a constant. The current supplied outside the semiconductor memory device from output terminal OUT is affected by the threshold voltage Vth of N channel MOS transistor 210, and the larger Vth, the smaller supplied current IDS.

At time t3, however, the threshold voltage Vth of N channel MOS transistor 210 increases by a substrate biasing effect, which will be now described.

At time t3, the source potential of N channel MOS transistor 210 is Vout, the potential of output terminal OUT, while the substrate portion of N channel MOS transistor 210 is at negative potential Vbb as described above, and therefore the source-substrate potential difference Vsb of N channel MOS transistor 210 is extremely large at time t3.

In general, the larger the source-substrate potential difference Vsb of a MOS transistor, the larger the threshold voltage Vth of the MOS transistor by a substrate biasing effect. Therefore, the Vth of N channel MOS transistor 210 increases at time t3 at which source-substrate potential difference Vsb is large.

Herein, based on expression (1), if threshold voltage Vth is large, output current IDS may be increased by increasing the gate-source potential difference Vgs of the MOS transistor by the corresponding amount. According to a conventional technique, a large output current is secured for output terminal OUT by setting the gate potential VG of N channel MOS transistor 210 at a sufficiently high level in other words setting boosted potential Vpp at a sufficiently high level, when output terminal OUT outputs an "H" level.

In recent years, however, as further high density integration of semiconductor devices and associated down sizing of MOS transistors have proceeded, the thickness of a gate oxide film in such a MOS transistor tends to be reduced every year accordingly. As a result, the breakdown voltage of a gate oxide film is lowered, and the reliability of a MOS transistor may be affected by setting the gate voltage at a high level. Consequently, raising boosted potential Vpp to a high level is most unlikely in the future.

Internal boosted potential Vpp is generated by a charge pump circuit in the semiconductor memory device based on external power supply potential Vdd.

The charge pump circuit produces a high potential by pumping up charges to the internal boosted voltage node at a prescribed frequency, using a capacitor formed on the semiconductor device.

If current consumption by internal boosted potential Vpp increases, the capacitance of the capacitor should be increased, or the prescribed frequency should be set higher. Thus increasing the capacitance of the capacitor requires a large area on the semiconductor substrate, which gives rise to increase in the cost of the semiconductor memory device. Meanwhile, the prescribed frequency may be increased to only a limited level, and the efficiency of transferring charges is lowered.

Japanese Patent Laying-Open No. 9-139077 proposes a pre-boost circuit which provides a load with current both from an external power supply and an internal boosted voltage node.

FIG. 17 is a circuit diagram showing the configuration of the pre-boost circuit. Referring to FIG. 17, an N channel MOS transistor QN1 is coupled between an external power supply potential Vdd and a node OUT1, and provided with an internal control signal IN1 at its gate. A P channel MOS transistor QN2 is coupled between internal boosted potential Vpp and node OUT1, and provided with an internal control signal IN2 at its gate, and the substrate portion is coupled to internal boosted potential Vpp.

When node OUT1 is boosted to the level of internal boosted potential Vpp, the circuit first turns on N channel MOS transistor QN1, previously boosts node OUT1 to the level of external power supply potential Vdd, and then turns on P channel MOS transistor QN2 to reduce current passed from internal boosted potential Vpp to node OUT1, in order to restrict current consumption with internal boosted potential Vpp.

In the circuit as shown in FIG. 17, however, when the level of boosted potential Vpp is instable, particularly at the time of turning on the power supply to use a DRAM, for example, the operation may be instable. Such a state will be further described.

FIG. 18 is a cross sectional view of the configuration of the pre-boost circuit in FIG. 17 used in a DRAM.

Referring to FIG. 18, an N well region 366 and a P well region 368 are formed on a P type silicon substrate 370, a P channel MOS transistor QN2 is formed in N well region 366 and an N channel MOS transistor QN1 is formed in P well region 368.

P type silicon substrate 370 is supplied with a negative potential Vbb through a P type impurity region 364, and N well region 366 is supplied with an internal boosted potential Vpp through an N type impurity region 372. A P type impurity region 352, the source of P channel MOS transistor QN2 is coupled with internal boosted potential Vpp, and a P type impurity region 356, the drain of P channel MOS transistor QN2 and an N type impurity region 358, the source of N channel MOS transistor QN1 are connected together to node OUT1.

A gate electrode 354, the gate of P channel MOS transistor QN2 is provided with internal control signal IN2 as an input, and a gate electrode 360, the gate of N channel MOS transistor QN1 is provided with internal control signal IN1 as an input.

Herein, immediately after turning on the power supply of the semiconductor memory device, or a terminal is affected by a disturbance, the charge pump circuit generating internal boosted potential Vpp becomes instable, which may cause internal boosted potential Vpp to be lower than external power supply potential Vdd.

In such a case, if internal control signal IN1 can turn on N channel MOS transistor QN1, node OUT1 is pulled to the level of external power supply potential Vdd, and a forward biasing is imposed on the PN junction between P type impurity region 356 and N well region 366. Then, a parasitic PNP type bipolar transistor formed of P type impurity region 356, N well region 366 and P type silicon substrate 370 is turned on, which could pass current from P type impurity region 356 to P type silicon substrate 370. Such a state could lead to a loss of data in a memory cell in the DRAM, and to a latch up.

Thus, if the potential of a well is pulled to the level of a potential generated in the semiconductor device, countermeasure should be provided in the circuit configuration to cope with an unpredictable undesirable situation as described above.

SUMMARY OF THE INVENTION

It is an object of the invention to provide a semiconductor memory device capable of restricting internal boosted potential Vpp from being raised, while applying sufficient current from an output terminal.

Another object of the invention is to provide a semiconductor memory device having a smaller chip area and a charge pump circuit portion of a smaller size, by using a practical circuit for restricting current consumption with internal boosted potential Vpp at the time of driving an output transistor in an output buffer circuit portion.

In summary, a semiconductor memory device according to the invention includes an output terminal, a first MOS transistor, a first driving circuit, and a second driving circuit.

The first MOS transistor supplies current from an external power supply to the output terminal. The first driving circuit drives the gate potential of the first MOS transistor in response to a first internal control signal. The second driving circuit drives the potential of the substrate portion of the first MOS transistor in response to the first internal control signal.

A semiconductor memory device according to another aspect of the invention includes an output terminal, a boost circuit, a first MOS transistor, a first switching circuit, a second switching circuit, and current limiting circuit.

The boost circuit generates a boosted potential higher than an external power supply potential. The first MOS transistor supplies the output terminal with current from the external power supply in response to the first internal control signal. The first switching circuit receives current supplied from the boost circuit and supplies current to the gate of the first MOS transistor in response to the first internal control signal. The second switching circuit receives current supplied from the external power supply through the current limiting circuit, and supplies current to the gate of the first MOS transistor in response to the first internal control signal. The current limiting circuit limits current input to the gate of the first MOS transistor from the external power supply as long as the boosted potential is not boosted to the level of a prescribed potential.

Therefore, according to the present invention, when an output transistor of the output buffer circuit supplies current, the threshold voltage of the output transistor can be prevented from increasing by appropriately limiting the potential of the substrate portion of the output transistor and the output current of the output transistor may be increased.

Furthermore, according to the present invention, current to drive the gate of the output transistor is advantageously supplied from internal boosted potential Vpp generation circuit besides from the external power supply, when the output terminal outputs an "H" level. The current consumption at internal boosted potential Vpp generation circuit may be restricted, a charge pump circuit for internal voltage boosting may be reduced in size, and therefore the chip area of the semiconductor memory device may be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
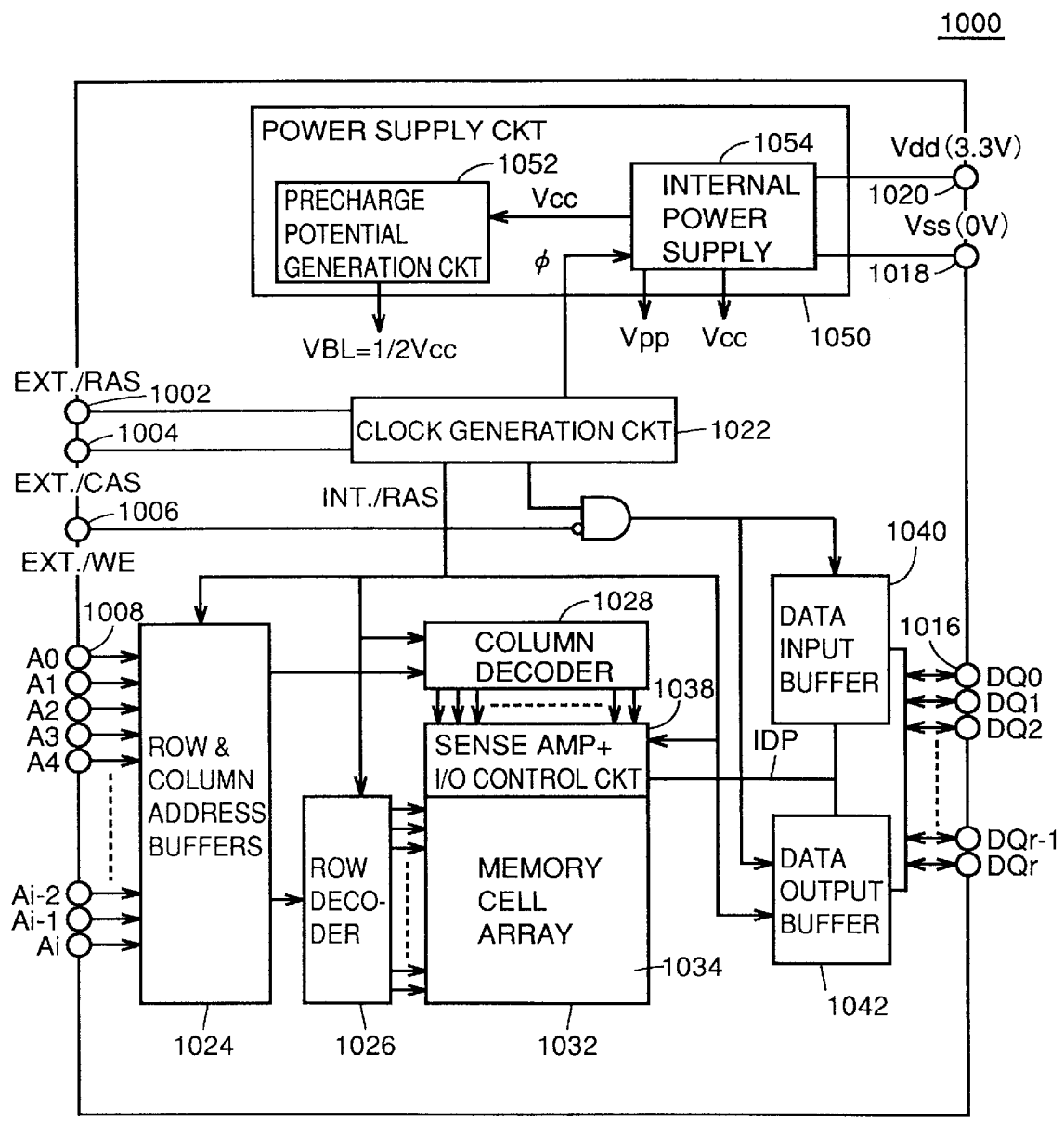
FIG. 1 is a schematic block diagram of the general configuration of a semiconductor memory device 1000 according to the invention.

A semiconductor memory device 1000 according to a first embodiment of the invention will be now described. In the following description, the same elements are denoted by the same reference characters, and the description will not be repeated.

FIG. 1 is a schematic block diagram showing the general configuration of the semiconductor memory device according to the present invention. The general configuration is a representative example applicable to all the other embodiments which will be described.

Referring to FIG. 1, semiconductor memory device 1000 includes control signal input terminals 1002 to 1006, an address signal input terminal group 1008, a data signal input/output terminal group 1016, a ground terminal 1018, and a power supply terminal 1020.

Semiconductor memory device 1000 includes a clock generation circuit 1022, a row and column address buffer 1024, a row decoder 1026, a column decoder 1028, a memory mat 1032, a data input buffer 1040, and a data output buffer 1042. Memory mat 1032 includes a memory cell array 1034 and a sense amplifier+input/output control circuit 1038.

Clock generation circuit 1022 selects a prescribed operation mode based on an external row address strobe signal ext./RAS and an external column address strobe signal ext./CAS which are externally applied through control signal input terminals 1002 and 1004, respectively, and controls the operation of the entire semiconductor memory device.

Row and column address buffer 1024 generates row address signals RA0 to RAi (i: natural number) and column address signals CA0 to CAi based on address signals A0 to Ai externally applied through address signal input terminal group 1008, and applies generated signals RA0 to RAi and CA0 to CAi to row decoder 1026 and column decoder 1028, respectively.

Memory mat 1032 includes a plurality of memory cells each storing 1-bit data. Each memory cell is located at a prescribed address determined by a row address and a column address.

Row decoder 1026 and column decoder 1028 specify a row address and a column address in memory cell array 1034, respectively. Sense amplifier+input/output control circuit 1038 connects a memory cell at an address specified by row decoder 1026 and column decoder 1028 to one end of a data signal input/output line pair IDP. The other end of data input/output line pair IDP is connected to data input buffer 1040 and data output buffer 1042.

Data input buffer 1040 responds to an externally applied signal EXT./WE through control signal input terminal 1006 in a writing mode to provide data input through data signal input terminal group 1016 to a selected memory cell through data signal input/output line pair IDP.

Data output buffer 1042 outputs data read out from a selected memory cell to data input/output terminal group 1016 in a reading mode.

A power supply circuit 1050 receives an external power supply potential Vdd and a ground potential Vss and supplies various internal power supply potentials necessary for the operation of the semiconductor memory device.

More specifically, power supply circuit 1050 includes an internal power supply circuit 1054 which receives external power supply potential Vdd and ground potential Vss to output internal lowered potential Vcc and internal boosted potential Vpp lowered and boosted respectively from external power supply potential Vdd, and a precharge potential generation circuit 1052 which supplies a precharge potential VBL to a bit line pair included in memory cell array 1034.

Figure 2:
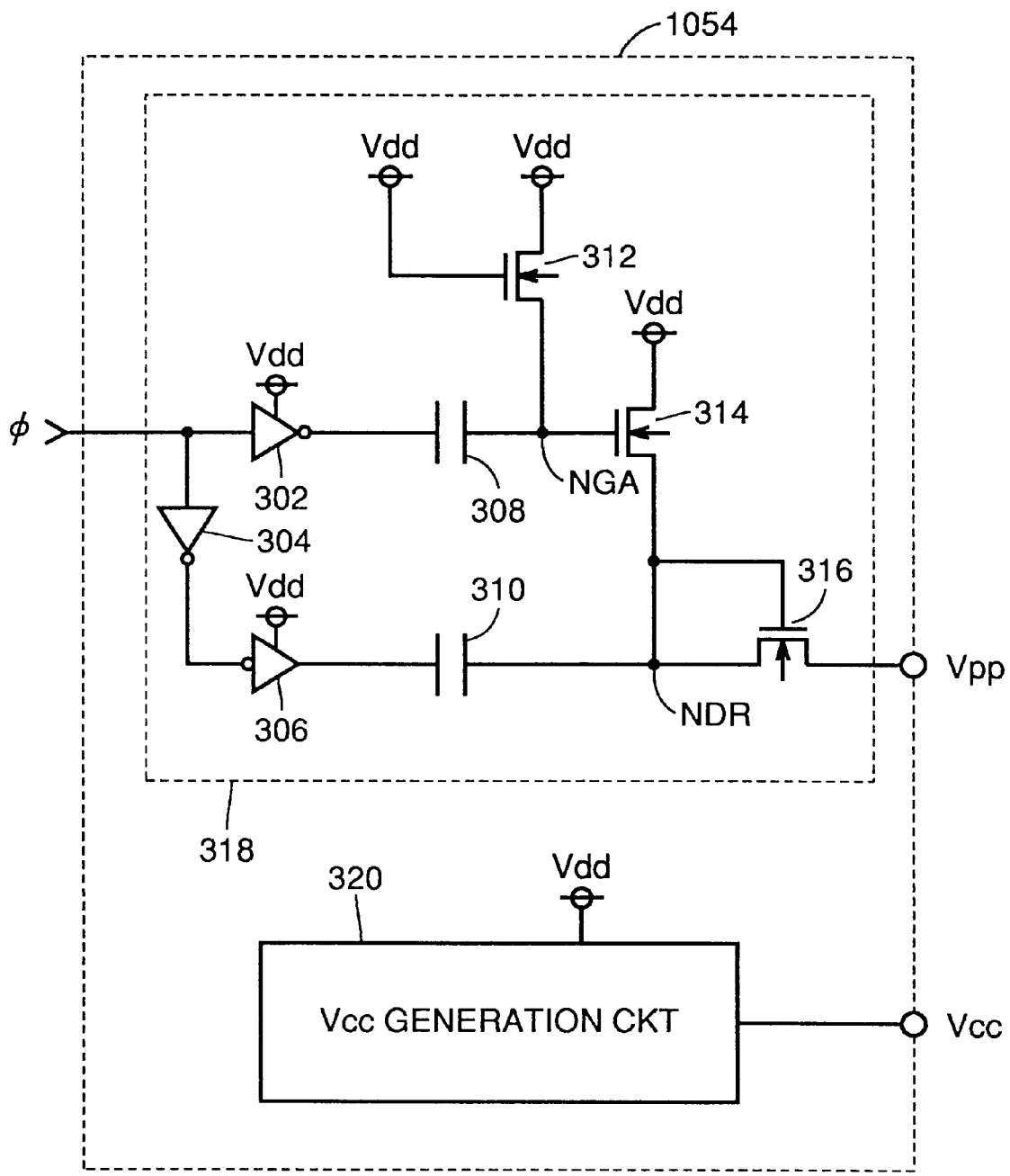
FIG. 2 is a circuit diagram showing in detail an internal power supply 1054 in semiconductor memory device 1000 in FIG. 1.

FIG. 2 is a circuit diagram showing the configuration of internal power supply 1054 included in semiconductor memory device 1000 shown in FIG. 1.

Referring to FIG. 2, internal power supply 1054 includes a charge pump circuit 318 for generating internal boosted potential Vpp based on external power supply potential Vdd and a Vcc generation circuit 320 for generating internal lowered potential Vcc based on external power supply potential Vdd.

Charge pump circuit 318 has inverters 302 and 304 which receives a clock signal φ generated in clock generation circuit 1022 on the semiconductor memory device, and an inverter 306 which receives the output of inverter 304.

The outputs of inverters 302 and 306 are connected to the electrodes of capacitors 308 and 310, respectively. The other electrode of capacitor 308 is diode-connected with the external power supply at a node NGA by transistor 312. The gate of transistor 314 receives the potential of node NGA. The other electrode of capacitor 310 is diode-connected with internal boosted potential Vpp at a node NDR by transistor 316. Transistor 314 is connected between external power supply potential Vdd and node NDR.

The potential of node NGA is raised to a higher potential than external power supply potential Vdd by the function of capacitor 308 in response to a change of clock signal φ from "H" to "L", which turns on transistor 314, and the potential of node NDR is pulled to the level of power supply potential Vdd.

When clock signal φ then changes from "L" to "H", transistor 314 attains a non-conductive state in response to the change, and the potential of node NDR is further raised by the amount of external power supply potential Vdd by the function of capacitor 310. Charge pump circuit 318 supplies current to internal boosted potential Vpp through transistor 316 serving as a diode at the time.

In the circuit, when the capacitance of capacitor 310 in the charge pump circuit is C, the pumping frequency f, and the threshold voltage of transistor 316 Vth, generated current Ipp is given by the following expression:

$$Ipp = fC\ (2Vdd - Vth - Vpp) \qquad (2)$$

Based on expression (2), C in the charge pump circuit may be reduced by reducing necessary generated current Ipp.

Figure 3:
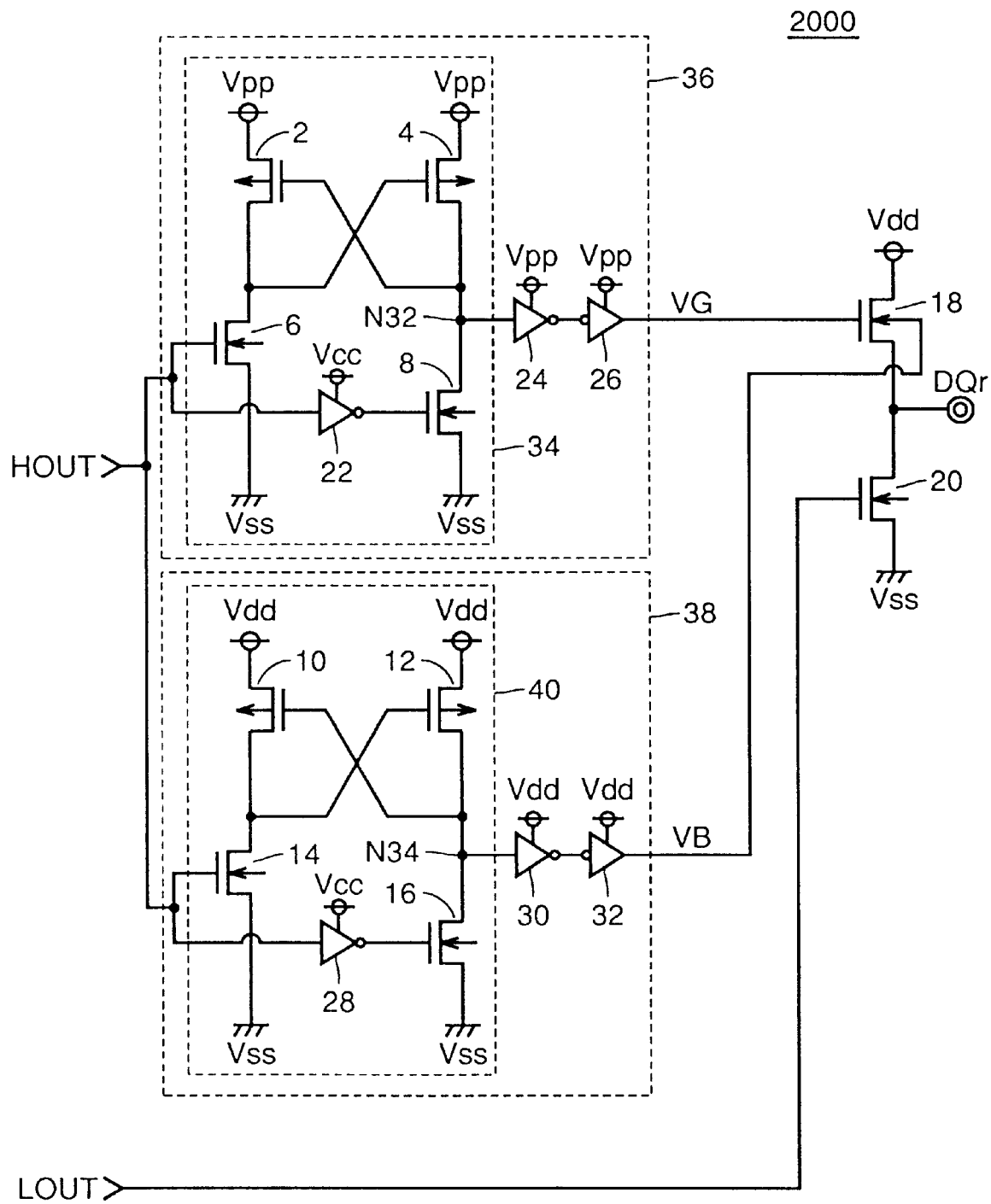
FIG. 3 is a circuit diagram of an output buffer circuit 2000 according to a first embodiment of the invention.

FIG. 3 is a circuit diagram showing the basic configuration of output buffer circuit 2000 used in semiconductor memory device 1000 according to the first embodiment.

Output buffer circuit 2000 is provided corresponding to one bit in data output buffer 1042 in FIG. 1, and receives, as input signals, a control signal from clock generation circuit 1022, and a first internal control signal HOUT and a second internal control signal LOUT which are complementary to each other generated based on read data from input/output control circuit 1038.

Referring to FIG. 3, output buffer circuit 2000 includes an output terminal DQr, an N channel MOS transistor 18 coupled between external power supply potential Vdd and output terminal DQr, an N channel MOS transistor 20 coupled between ground potential Vss and output terminal DQr and receiving second internal control signal LOUT at its gate, a driving circuit 36 which receives first internal control signal HOUT and outputs a signal VG to drive the gate of N channel MOS transistor 18, and a substrate potential driving circuit 38 which receives first internal control signal HOUT and drives the substrate portion of N channel MOS transistor 18.

Driving circuit 36 includes a level changing circuit 34 which changes the "H" level of first internal control signal HOUT from internal lowered potential Vcc to internal boosted potential Vpp, and inverters 24 and 26 connected in series to receive the output of level changing circuit 34 and drive the gate of N channel MOS transistor 18.

Level changing circuit 34 has an N channel MOS transistor 6 which receives first internal control signal HOUT at its gate, an inverter 22 which inverts received first internal control signal HOUT, and an N channel MOS transistor 8 which receives the output of inverter 22 at its gate.

The sources of N channel MOS transistors 6 and 8 are both coupled to ground potential Vss.

Level changing circuit 34 further includes a P channel MOS transistor 2 coupled between internal boosted potential Vpp and the drain of N channel MOS transistor 6 to receive the potential of the drain of N channel MOS transistor 8 at its gate, and a P channel MOS transistor 4 coupled between internal boosted potential Vpp and the drain of N channel MOS transistor 8 to receive the potential of the drain of N channel MOS transistor 6 at its gate.

Level changing circuit 34 outputs, to inverter 24, an output signal from node N32 connected with the drain of N channel MOS transistor 8, in other words outputs a signal which is in phase with internal control signal HOUT and whose "H" level attains internal boosted potential Vpp.

Substrate potential driving circuit 38 includes a level changing circuit 40 which changes the "H" level of first internal control signal HOUT from the level of internal lowered potential Vcc to the level of external power supply potential Vdd, and inverters 30 and 32 connected in series which receive the output of level changing circuit 40 and drive the substrate portion of N channel MOS transistor 18.

Level changing circuit 40 has an N channel MOS transistor 14 which receives first internal control signal HOUT at its gate, an inverter 28 which inverts received first internal control signal HOUT, and an N channel MOS transistor 16 which receives the output of inverter 28 at its gate.

The sources of N channel MOS transistors 14 and 16 are both coupled to ground potential Vss.

Level changing circuit 40 further includes a P channel MOS transistor 10 coupled between external power supply potential Vdd and the drain of N channel MOS transistor 14 and receiving the potential of the drain of N channel MOS transistor 16 at its gate, and a P channel MOS transistor 12 coupled between external power supply potential Vdd and the drain of N channel MOS transistor 16 and receiving the potential of the drain of N channel MOS transistor 14 at its gate.

Level changing circuit 40 outputs, to inverter 30, an output signal from node N34 connected with the drain of N channel MOS transistor 16, in other words outputs a signal which is in phase with first internal control signal HOUT and whose "H" level attains the level of external power supply potential Vdd.

Cross sections of N channel MOS transistors 18 and 20 serving as the output transistors of output buffer circuit 2000 will be now described.

Figure 4:
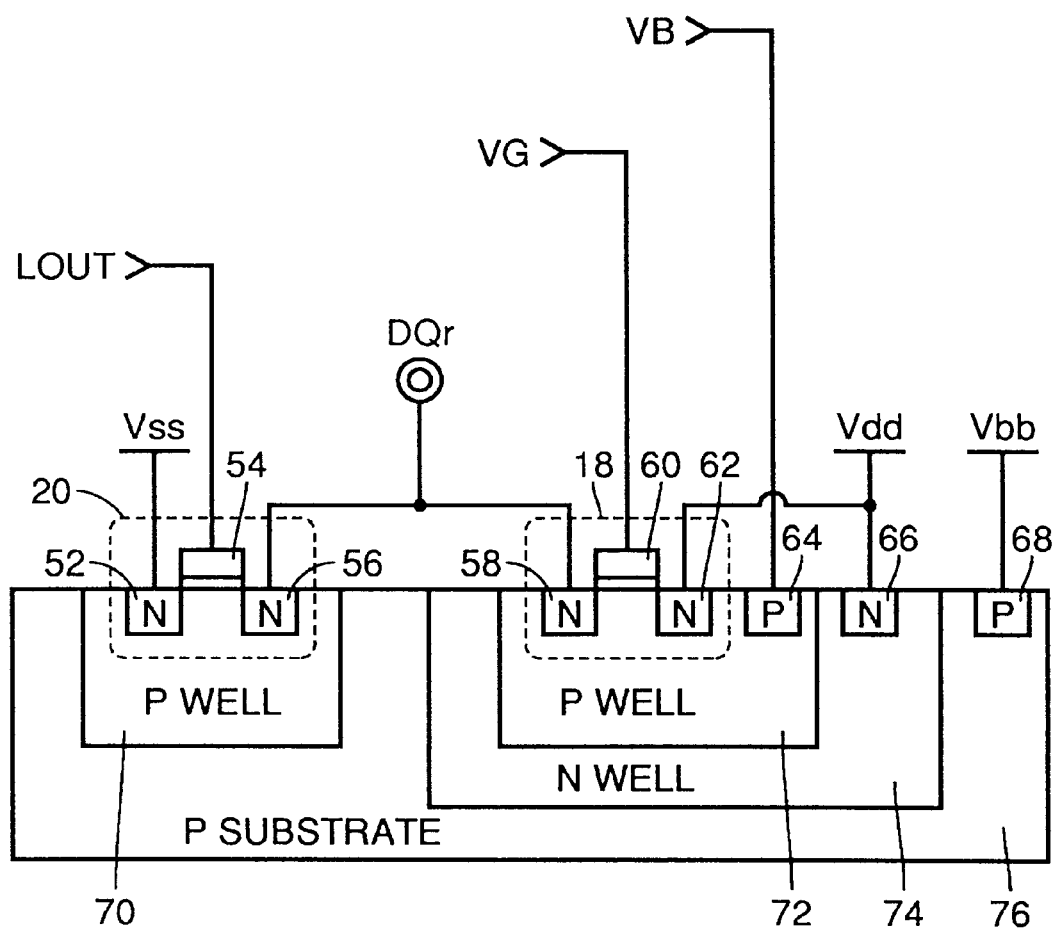
FIG. 4 is a diagram for use in illustration of a cross section of an output transistor portion in output buffer circuit 2000 in FIG. 3 according to the first embodiment.

FIG. 4 is a diagram for use in illustration of cross sections of N channel MOS transistors 18 and 20.

Referring to FIG. 4, in the semiconductor memory device according to the first embodiment, on a first P well region 70 and an N well region 74 are formed on a main surface of a P type silicon substrate 76, and a second P well region 72 is formed in N well region 74.

N well region 74 may be formed into a so-called triple-well structure including for example a first N type region formed in a prescribed depth in the substrate and a second N type region formed closer to the surface.

N channel MOS transistors 20 and 18 are formed in P well regions 70 and 72, respectively.

N channel MOS transistor 20 includes N type impurity regions, a source 52 and a drain 56, and a gate electrode 54. N channel MOS transistor 18 includes N type impurity regions, a source 58 and a drain 62, and a gate electrode 60.

The source 52 of N channel MOS transistor 20 is coupled with ground potential Vss, and second internal control signal LOUT is input to gate electrode 54. The drain 56 of N channel MOS transistor 20 is connected with output terminal DQr together with source 58 of N channel MOS transistor 18. The drain of N channel MOS transistor 18 is coupled with external power supply potential Vdd.

A P type impurity region 68 is formed on the main surface of P type silicon substrate 76, and P type silicon substrate 76 is supplied with a negative potential Vbb through P type impurity region 68.

Also in FIG. 4, N well region 74 is coupled with external power supply potential Vdd through N type impurity region 66, and P well region 72 is therefore electrically isolated from P well region 70 and P type silicon substrate 76.

Figure 5:
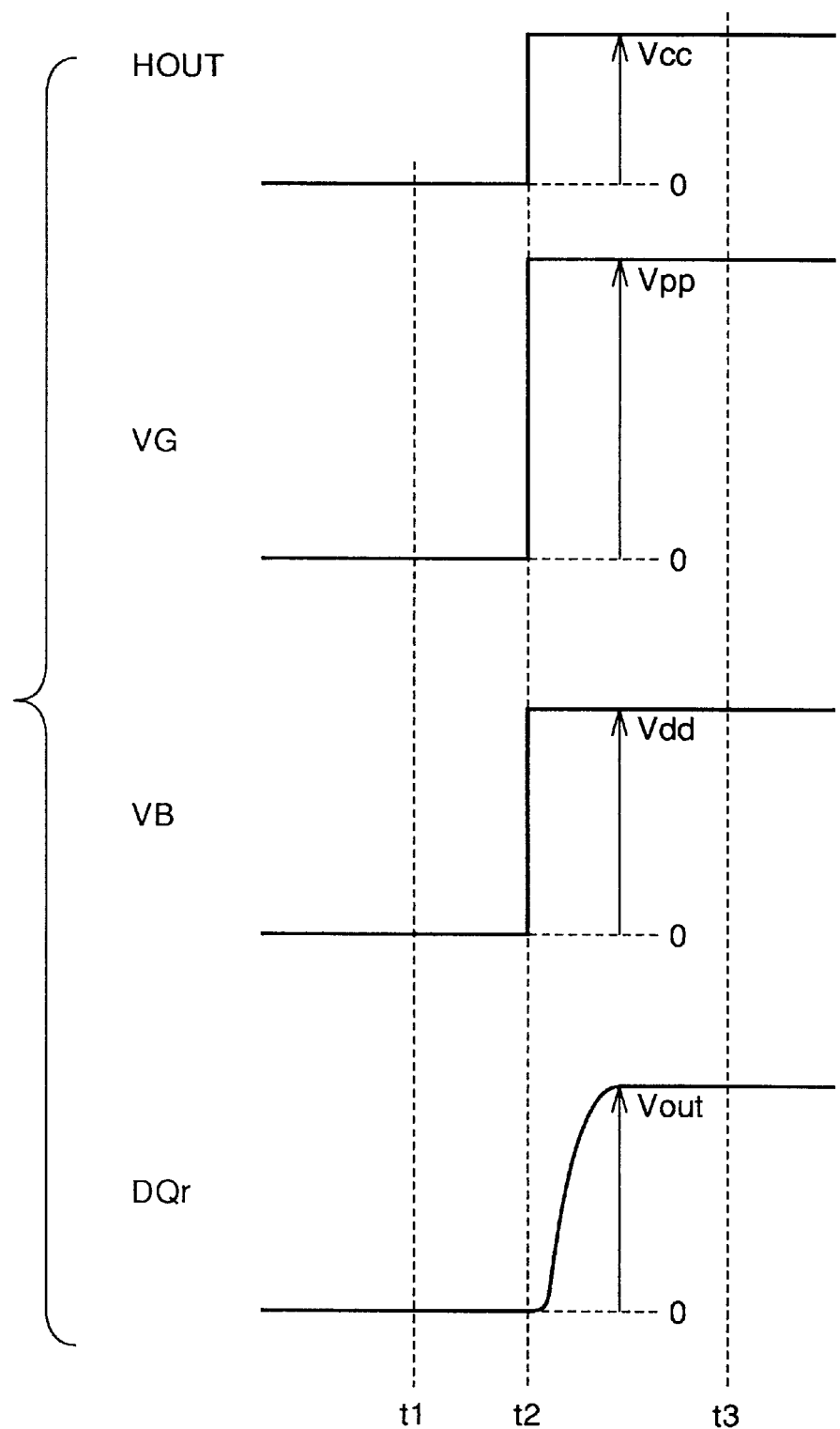
FIG. 5 is an operation waveform chart for use in illustration of the operation of output buffer circuit 2000 in FIG. 3.

FIG. 5 is an operation waveform chart for use in illustration of the operation of buffer circuit 2000 shown in FIG. 3.

Referring to FIGS. 3, 4 and 5, let us now assume that internal control signal LOUT is in an "L" state. At the time, N channel MOS transistor 20 is in a non-conductive state.

Assume that the level of output terminal OUT is initially at 0V.

At time t1, first internal control signal HOUT is at an "L" level, and N channel MOS transistor 6 is in a non-conductive state. Since the inverse of internal control signal HOUT is provided to the gate by inverter 22, N channel MOS transistor 8 conducts, and node N32 attains an "L" level. P channel MOS transistor 2 which receives the potential of node N32 at its gate conducts, and applies boosted potential Vpp to the gate of P channel MOS transistor 4. As a result, P channel MOS transistor 4 attains a non-conductive state, and the potential of node N32 in other words, the output of level changing circuit 34 is determined as "L" level. Potential VG at the gate electrode 60 of N channel MOS transistor 18 attains an "L" level by the function of the series-connection of inverters 24 and 26.

Meanwhile, in substrate potential driving circuit 38, internal control signal HOUT is at an "L" level, and therefore N channel MOS transistor 14 is in a non-conductive state, while N channel MOS transistor 16 provided with the inverted signal at its gate by inverter 28 conducts. Node N34 then attains an "L" level. P channel MOS transistor 10 conducts upon receiving the potential of node N34 at its gate, and provides external power supply potential Vdd to the gate of P channel MOS transistor 12. As a result, P channel MOS transistor 12 attains a non-conductive state, and the potential of node N34 in other words the output of level changing circuit 40 is determined as "L" level. The potential of the substrate portion VB of N channel MOS transistor 18 (the potential of P well region 72) attains an "L" level, in other words attains ground potential Vss.

Consequently, at time t1, N channel MOS transistor 18 attains a non-conductive state, and the potential of output terminal DQr remains in the initial state of 0V.

Then, at time t2, when first internal control signal HOUT rises from 0V to internal lowered potential Vcc, N channel MOS transistor 6 conducts accordingly in driving circuit 36, first internal control signal HOUT is inverted by inverter 22, and N channel MOS transistor 8 receiving the inverted signal at its gate attains a non-conductive state. The gate of P channel MOS transistor 4 is therefore provided with an "L" level through N channel MOS transistor 6, P channel MOS transistor 4 conducts, and the potential of node N32 is raised to internal boosted potential Vpp. P channel MOS transistor 2 having its gate connected with node N32 attains a non-conductive state accordingly.

As a result, the potential of node N32, in other words, the output of level changing circuit 34 is determined as "H" level, and attains the level of boosted potential Vpp. State differently, the "H" level of first internal control signal HOUT is changed from the level of internal lowered potential Vcc to the level of internal boosted potential Vpp. The potential is input to the gate electrode 60 of N channel MOS transistor 18 by inverters 24 and 26, and its gate potential VG is raised from 0V to internal boosted potential Vpp. N channel MOS transistor 18 conducts accordingly, and starts raising the potential of output terminal DQr as is the case with the conventional output buffer circuit shown in FIG. 14.

According to the first embodiment of the invention, at time t2, the potential of the substrate portion (P well region 72) of N channel MOS transistor 18 is driven by substrate potential driving circuit 38 at the same time, unlike the case of the conventional output buffer circuit. The operation will be now described.

In response to a rising of first internal control signal HOUT, N channel MOS transistor 14 conducts in substrate potential driving circuit 38, first internal control signal HOUT is in turn inverted by inverter 28, and N channel MOS transistor 16 receiving the inverted signal at its gate attains a non-conductive state. The gate of P channel MOS transistor 12 therefore receives an "L" level through N channel MOS transistor 14, P channel MOS transistor 12 conducts and the potential of node N34 is raised to the level of external power supply potential Vdd. P channel MOS transistor 10 having its gate connected with node N34 attains a non-conductive state accordingly.

The output of level changing circuit 40, in other words, the potential of node N34 is therefore determined as "H" level, and attains the level of external power supply potential Vdd. Stated differently, the "H" level of first internal control signal HOUT is changed from the level of internal lowered potential Vcc to external power supply potential Vdd. The potential is provided to the substrate portion (P well region 72) of N channel MOS transistor 18 by inverters 30 and 32, and substrate potential VB is raised from 0V to external power supply potential Vdd as a result.

A time t3, a load capacitance connected with output terminal DQr outside the semiconductor memory device is sufficiently charged by the conduction of N channel MOS transistor 18, and the potential of output DQr is stabilized.

Figure 14:
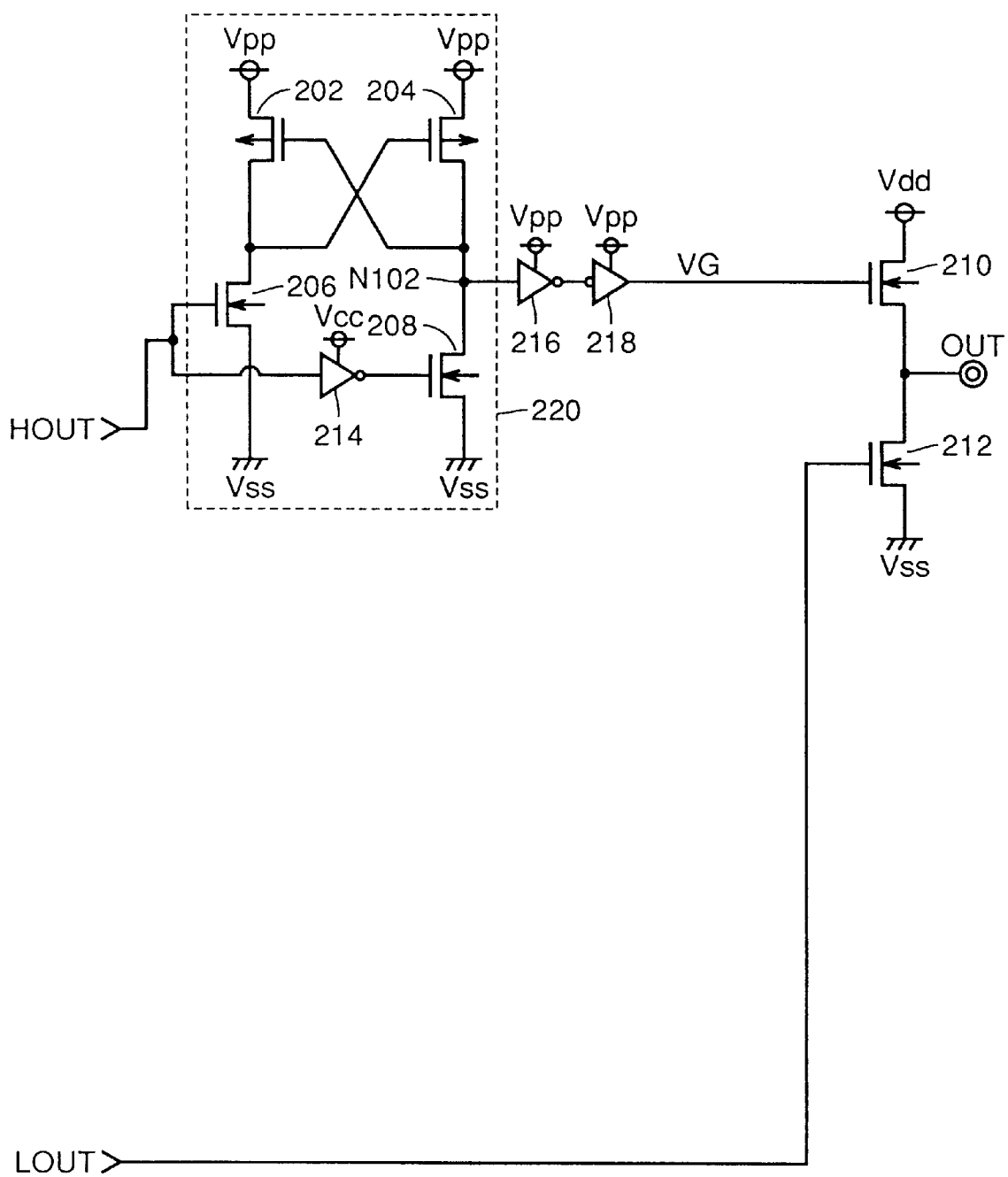
FIG. 14 is a circuit diagram of an output buffer circuit in a conventional semiconductor memory device.
Figure 15:
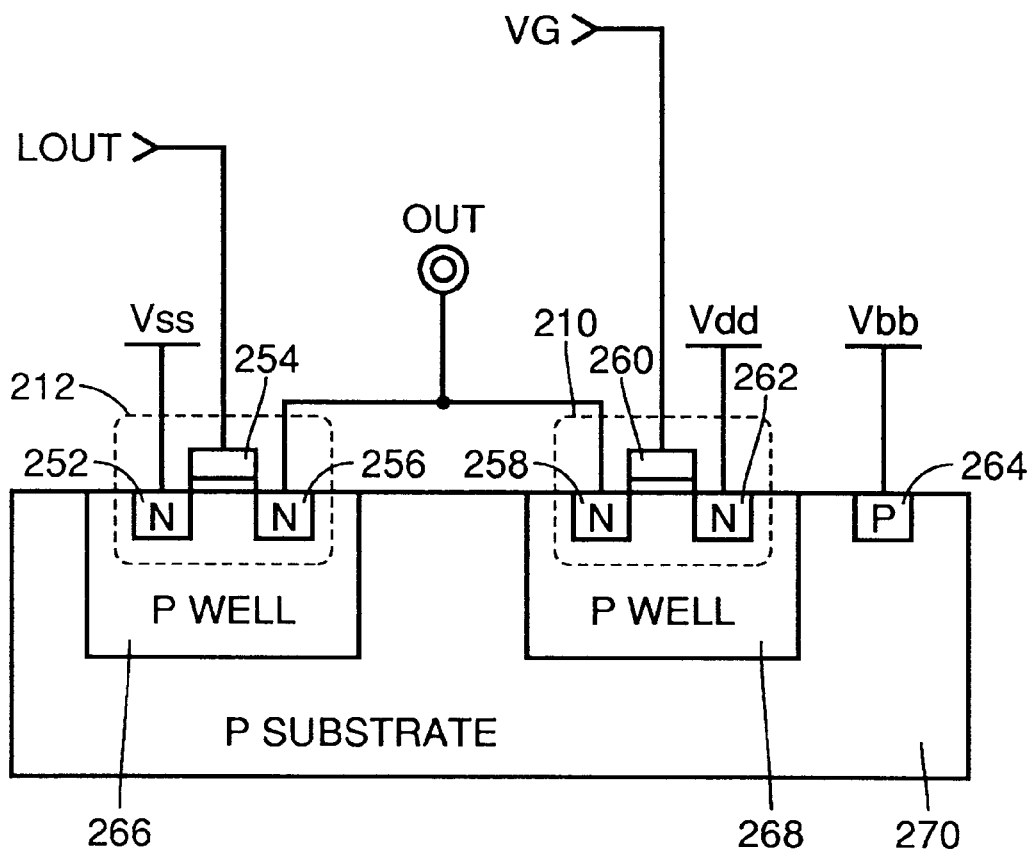
FIG. 15 is a diagram for use in illustration of a cross section of an output transistor portion in the output buffer circuit in FIG. 14.
Figure 16:
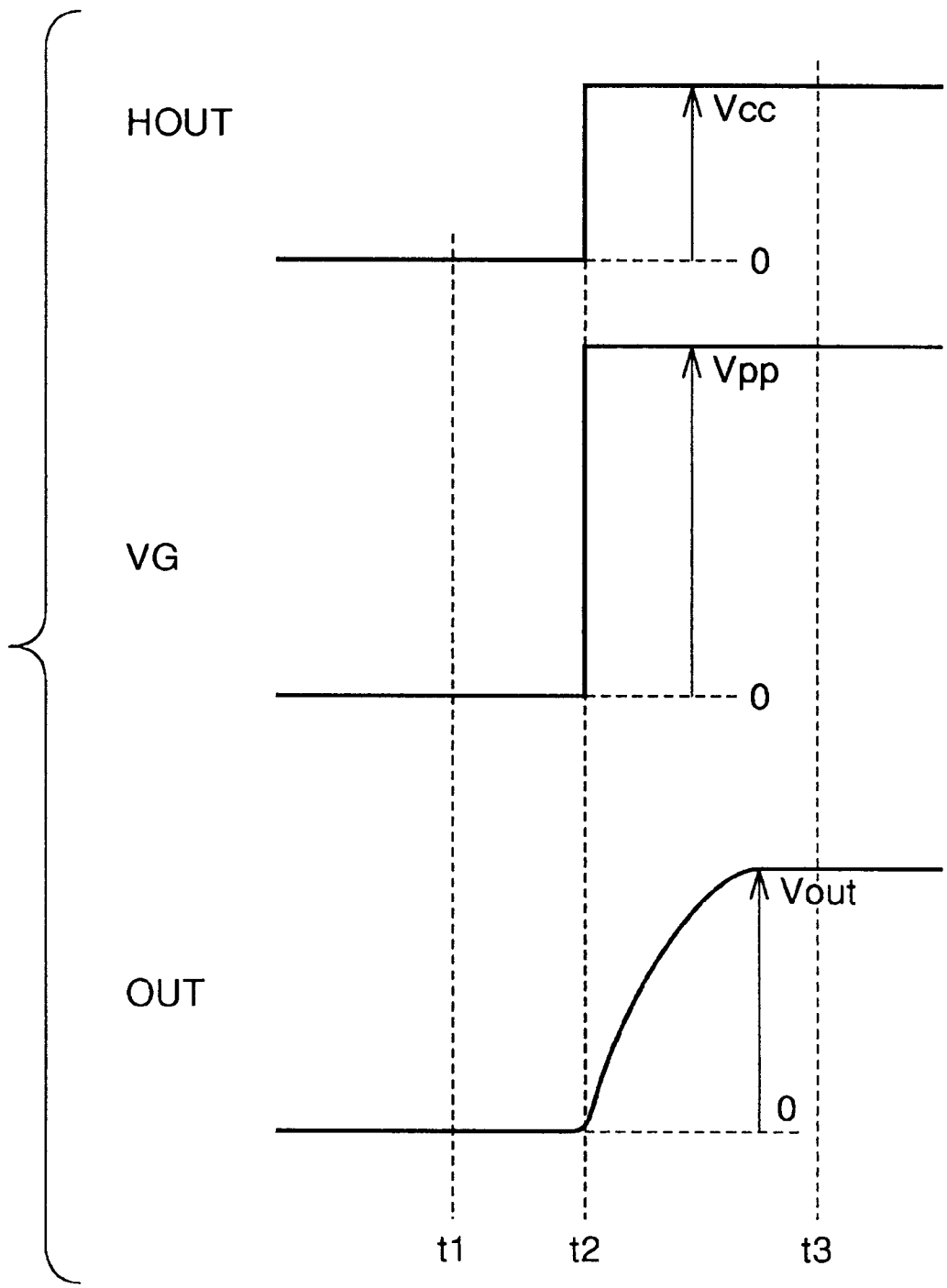
FIG. 16 is an operation waveform chart for use in illustration of the operation of the output buffer circuit in FIG. 14.
Figure 17:
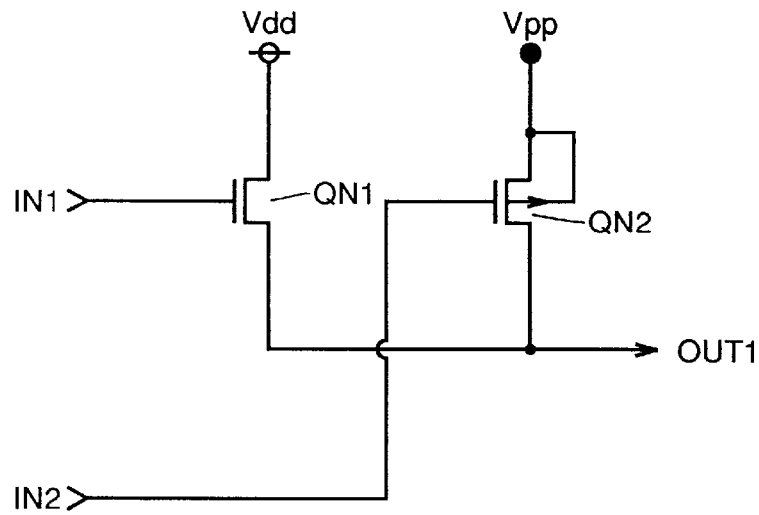
FIG. 17 is a circuit diagram of a conventional pre-boost circuit.
Figure 18:
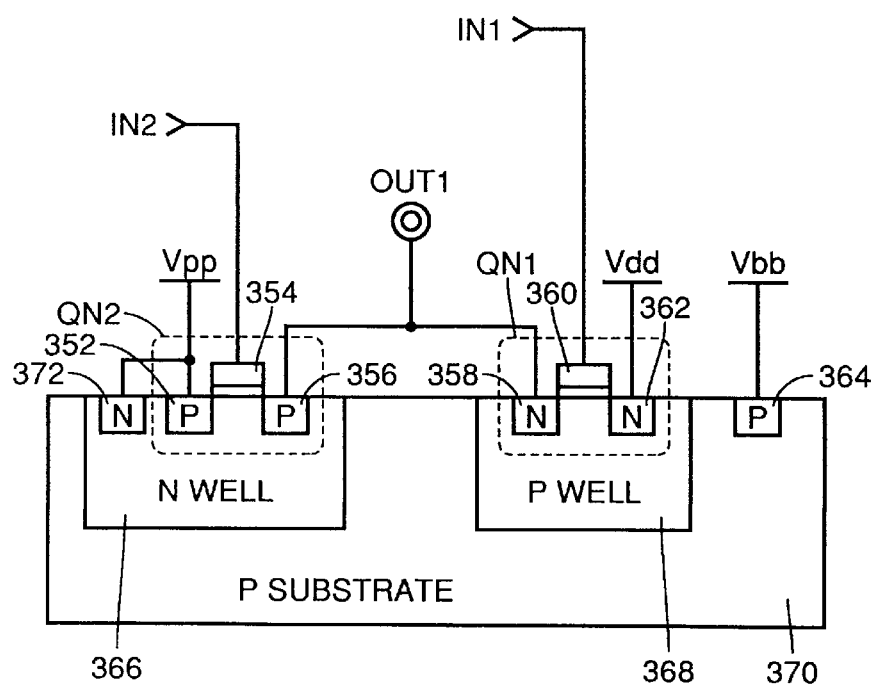
FIG. 18 is a diagram for use in illustration of a cross section of the pre-boost circuit in FIG. 17.

Now, during the period from t2 to t3, current supplied from N channel MOS transistor 18 to the output terminal is given by expression (1), while the potential of the substrate portion (P well region 72) of N channel MOS transistor 18 is less affected by the substrate biasing effect than the conventional case shown in FIG. 14, because the potential is pulled to the level of external power supply potential Vdd, and increased current IDS may be secured as a result. It is therefore not necessary to raise internal boosted potential Vpp more than the conventional case.

Furthermore, in FIG. 4, since substrate potential VB attains the level of external power supply potential Vdd, the potential of P well region 72 attains the level of external power supply potential Vdd, a forward bias is applied on the boundary with N type impurity region 58, and by the function of the PN junction of the portion, further current may be supplied to output terminal DQr independently of N channel MOS transistor 18. Even larger current may be externally supplied to the outside of the semiconductor memory device from output terminal DQr.

First Variation of First Embodiment

In a first variation of the semiconductor memory device according to the first embodiment of the invention, N channel MOS transistor 18 shown in FIG. 3 is electrically isolated from the substrate portion of N channel MOS transistor 20 in a method different from that of the first embodiment.

Figure 6:
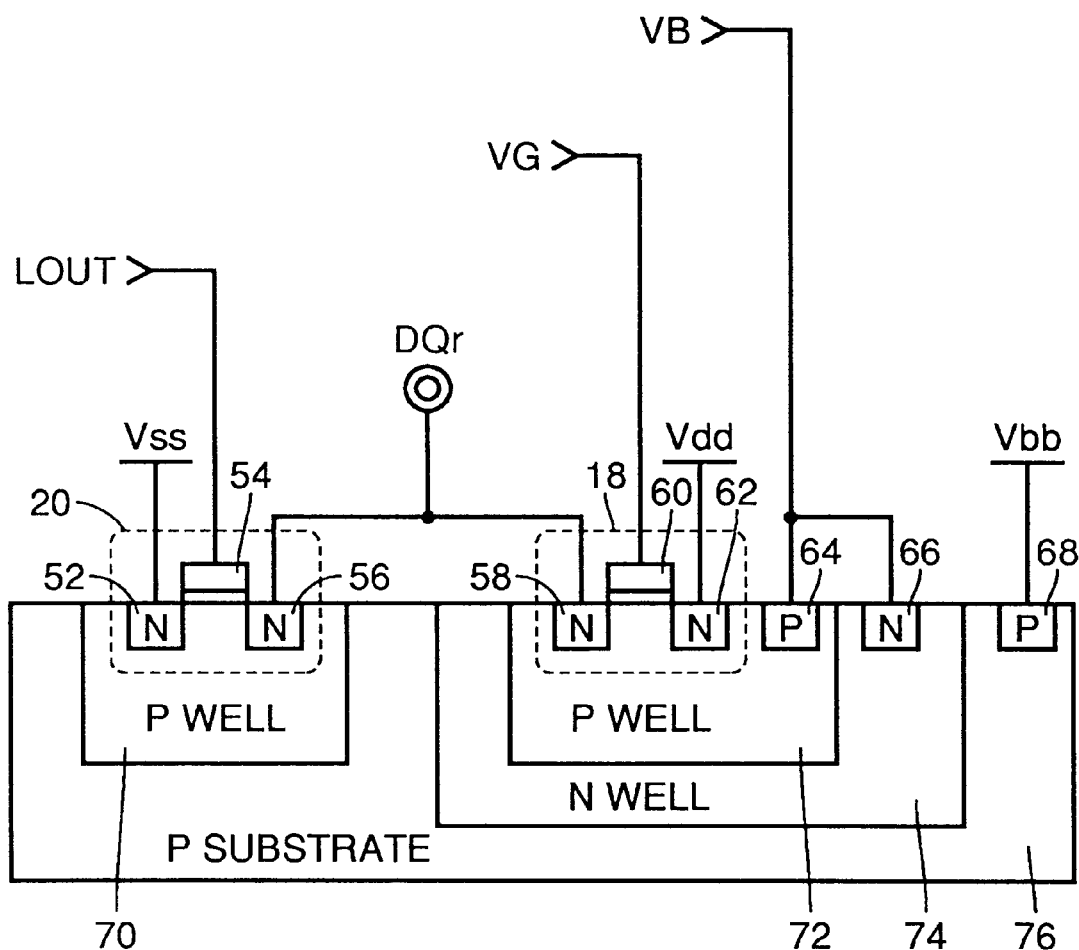
FIG. 6 is a diagram for use in illustration of a cross section of a first variation of the output transistor portion in output buffer circuit 2000 in FIG. 3 according to the first embodiment.

FIG. 6 is a diagram for use in illustration of cross sections of N channel MOS transistors 18 and 20 according to the first variation of the first embodiment.

In FIG. 6, N well region 74 formed on P type silicon substrate 76 is connected with P well region 72 which supplies the substrate potential of N channel MOS transistor 18 through impurity regions 64 and 66, and the potential is substrate potential VB, unlike the case of the first embodiment.

In this variation, the same effects as the first embodiment may be brought about.

Second Variation of First Embodiment

A second variation of the first embodiment of the invention is different from the first embodiment also in the method of electrically isolating the substrate portion of N channel MOS transistor 18 from the substrate portion of N channel MOS transistor 20 shown in FIG. 3 as is the case with the first variation.

Figure 7:
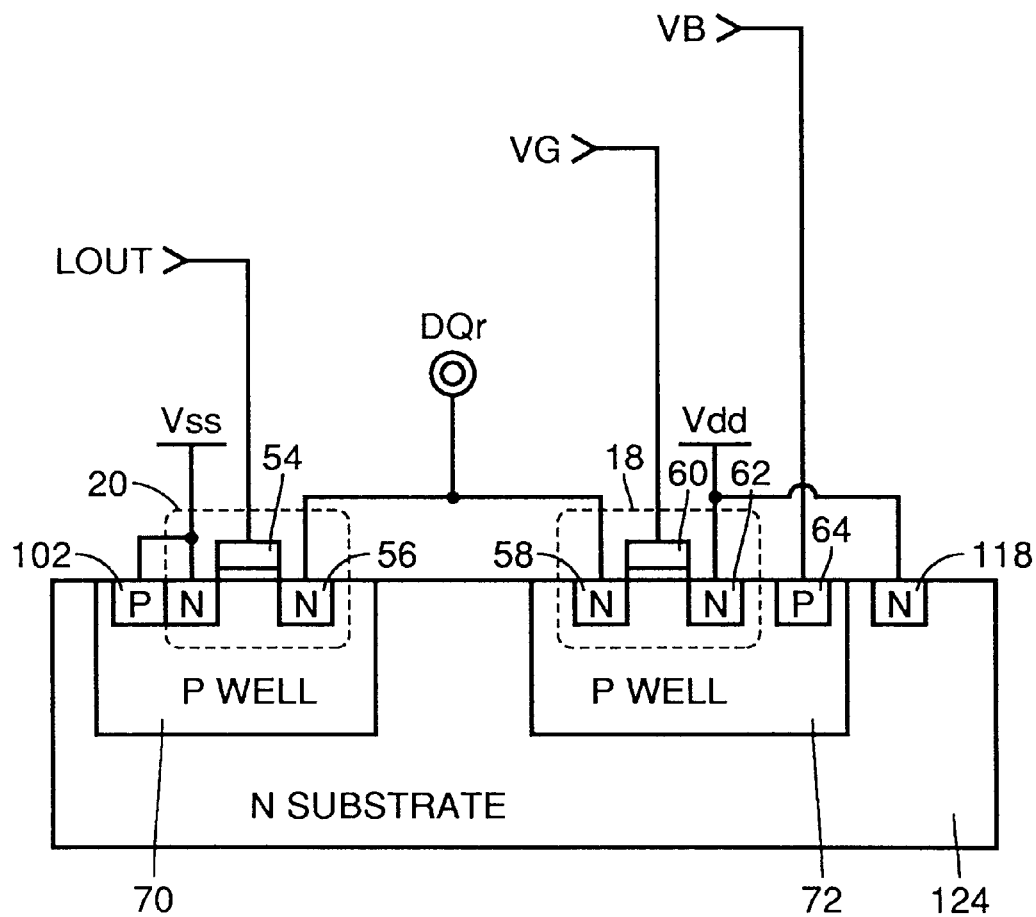
FIG. 7 is a diagram for use in illustration of a cross section of a second variation of the output transistor portion in output buffer circuit 2000 in FIG. 3 according to the first embodiment.

FIG. 7 is a diagram for use in illustration of cross sections of N channel MOS transistors 18 and 20 according to the second variation of the first embodiment.

In FIG. 7, an N type silicon substrate 124 is used for the substrate of the semiconductor memory device. N channel MOS transistors 20 and 18 are respectively formed in P well regions 70 and 72, which are both provided on N type silicon substrate 124. N type silicon substrate 124 is supplied with external power supply potential Vdd through N channel impurity region 118, while P well region 70 is supplied with ground potential Vss through a P type impurity region 102, unlike the first embodiment.

The same effects as the first embodiment may be brought about in this variation.

Third Variation of First Embodiment

Figure 8:
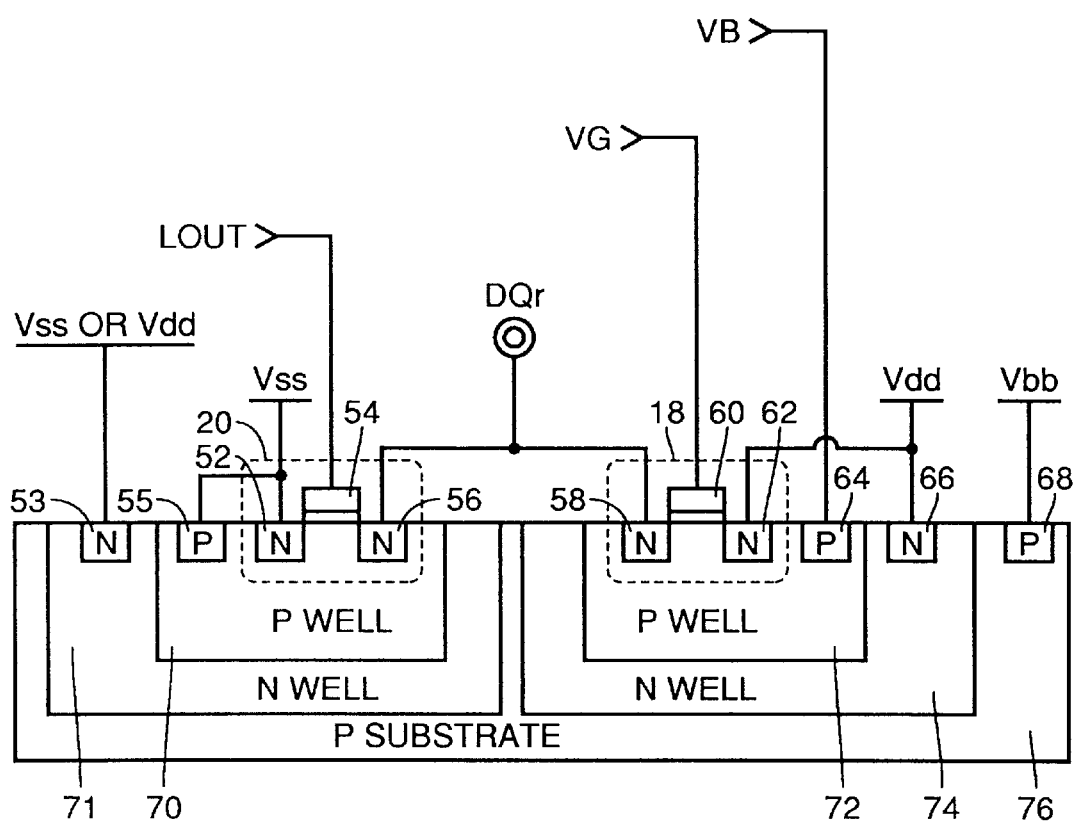
FIG. 8 is a diagram for use in illustration of a cross section of a third variation of the output transistor portion in output buffer circuit 2000 in FIG. 3 according to the first embodiment.

FIG. 8 is a diagram for use in illustration of cross sections of N channel MOS transistors 18 and 20 according to a third variation of the first embodiment.

The semiconductor memory device according to the third variation of the first embodiment is different from the first embodiment in the method of electrically isolating the substrate portion of N channel MOS transistor 18 from the substrate portion of N channel MOS transistor 20 shown in FIG. 3, as is the case with the first variation.

More specifically, the semiconductor memory device according to the third variation is different from the first embodiment in the following points.

In FIG. 8, second N well region 71 is formed on the main surface of P type silicon substrate 76. N channel MOS transistor 20 is formed in P well region 70, which is formed in second N well region 71.

P well region 70 is supplied with ground potential Vss through a P type impurity region 55 formed in P well region 70.

An N type impurity region 53 is formed in second N well region 71 which is supplied with external power supply potential Vdd or ground potential Vss through N type impurity region 53.

In this variation, the same effects as the first embodiment may be brought about.

Note that if the potential of second N well region 71 is fixed at the level of external power supply potential Vdd, N well region 74 and second N well region 71 may be formed in the same N well region without being isolated.

Fourth Variation of the First Embodiment

Figure 9:
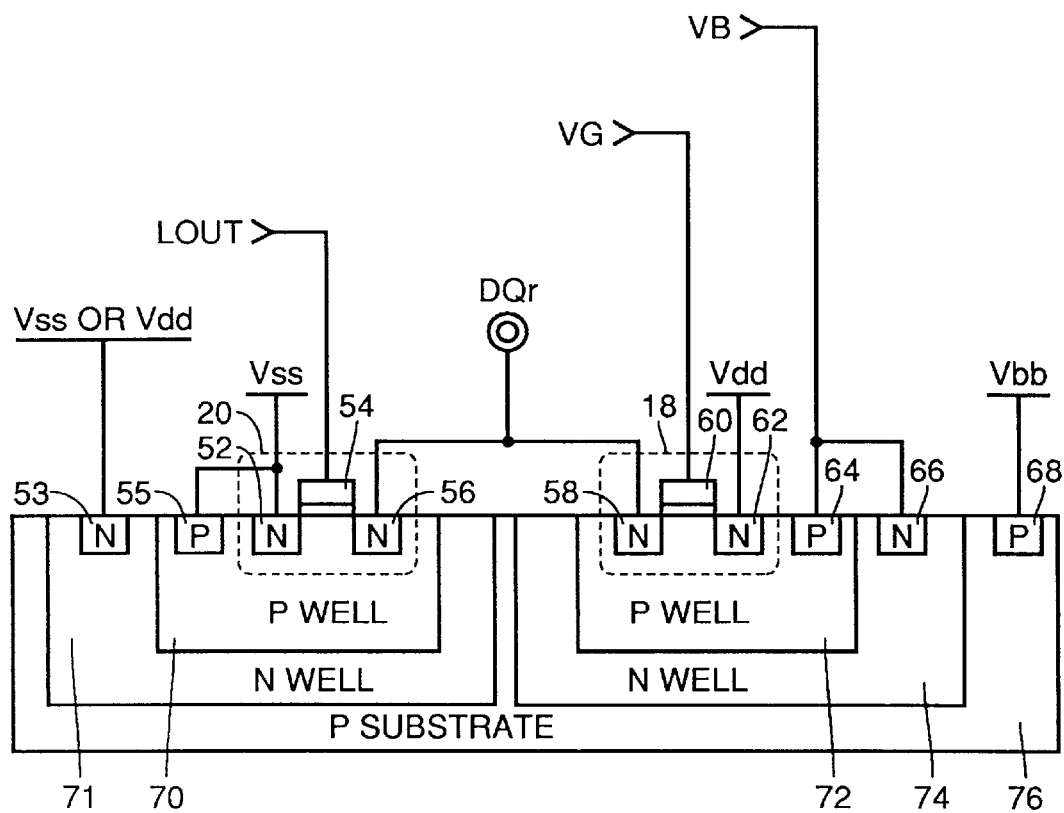
FIG. 9 is a diagram for use in illustration of a cross section of a fourth variation of the output transistor portion in output buffer circuit 2000 in FIG. 3 according to the first embodiment.

FIG. 9 is a diagram for use in illustration of cross sections of N channel MOS transistors 18 and 20 in a fourth variation of the first embodiment.

The semiconductor memory device according to the fourth variation of the first embodiment is different from the first embodiment in the method of electrically isolating the substrate portion of N channel MOS transistor 18 from the substrate portion of N channel MOS transistor 20 as is the case with the first variation.

More specifically, the semiconductor device according to the fourth variation is different from the first embodiment in the following points.

In FIG. 9, second N well region 71 is formed on the main surface of P type silicon substrate 76. N channel MOS transistor 20 is formed in P well region 70 which is formed in second N well region 71.

P well region 70 is supplied with ground potential Vss through P type impurity region 55 formed in P well region 70.

N type impurity region 53 is formed in second N well region 71 which is supplied with external power supply potential Vdd or ground potential Vss through N type impurity region 53 (these features are the same as the third variation shown in FIG. 8.)

In addition, in FIG. 9, N well region 74 formed on P type silicon substrate 76 is connected with P well region 72 which supplies the substrate potential of N channel MOS transistor 18 through impurity regions 64 and 66, and the potential is at the level of substrate potential VB.

Also in this variation, the same effects as the first embodiment may be provided.

Second Embodiment

A semiconductor memory device according to a second embodiment of the invention is directed to restricting current consumption by the circuit which generates the voltage at the level of internal boosted potential Vpp by supplying current to charge the gate of an output transistor in its output buffer circuit portion from an external power supply as well as by a circuit which generates internal boosted potential Vpp.

Figure 10:
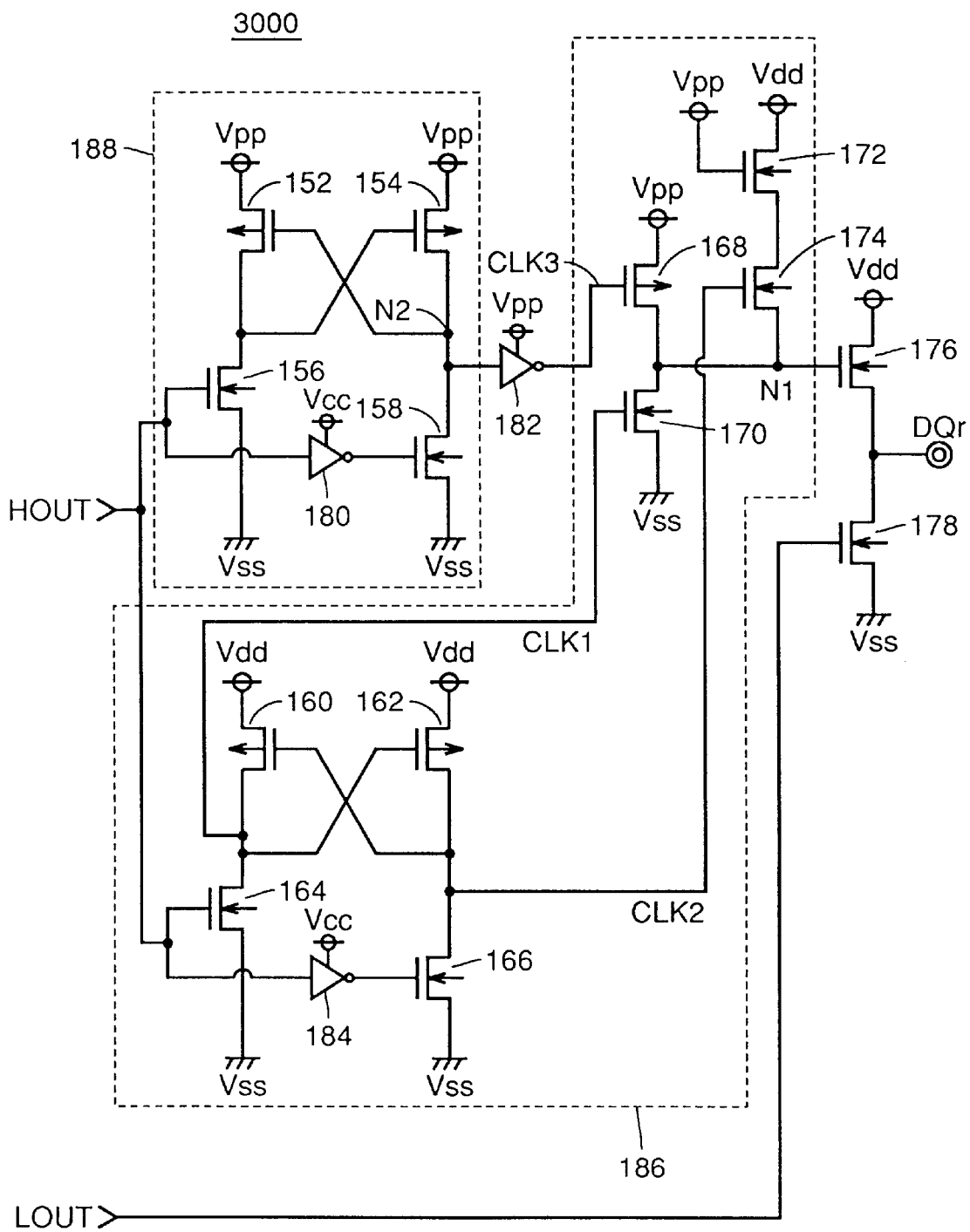
FIG. 10 is a circuit diagram of an output buffer circuit 3000 according to a second embodiment of the invention.

FIG. 10 is a circuit diagram showing the general configuration of an output buffer circuit 3000 used in the semiconductor memory device according to the second embodiment.

The general configuration of the semiconductor memory device according to the second embodiment is substantially identical to the first embodiment. Output buffer circuit 3000 is provided for 1 bit in data output buffer 1042 in FIG. 1 and receives, as input signals, first internal signal HOUT and second internal signal LOUT complementary to each other, generated based on a control signal from clock generation circuit and read data from input/output control circuit 1038.

Referring to FIG. 10, output buffer circuit 3000 includes an output terminal DQr, an N channel MOS transistor 176 coupled between an external power supply potential Vdd and output terminal DQr, an N channel MOS transistor 178 coupled between a ground potential Vss and output terminal DQr and receiving second internal control signal LOUT at its gate, a level changing circuit 188 which receives first internal control signal HOUT and changes its "H" level to the level of internal boosted potential Vpp, an inverter 182 which inverts the received output of level changing circuit 188, and a pre-boost circuit 186 which receives a signal CLK3 output from inverter 182 and controls the gate potential of N channel MOS transistor 176 serving as an output transistor in response to signal CLK3.

Level changing circuit 188 includes an N channel MOS transistor 156 receiving first internal control signal HOUT at its gate, an inverter 180 which inverts received first internal control signal HOUT, and an N channel MOS transistor 158 which receives the output of inverter 180 at its gate.

The sources of N channel MOS transistors 156 and 158 are coupled together to ground potential Vss.

Level changing circuit 188 further includes a P channel MOS transistor 152 coupled between internal boosted potential Vpp and the drain of N channel MOS transistor 156 to receive at its gate the potential of the drain of N channel MOS transistor 158, and a P channel MOS transistor 154 coupled between internal boosted potential Vpp and the drain of N channel MOS transistor 158 to receive at its gate the potential of the drain of N channel MOS transistor 156.

Node N2 connected with the drain of N channel MOS transistor 158 outputs a signal in phase with the first internal control signal HOUT which is output from level changing circuit 181 and whose "H" level is pulled to internal boosted potential Vpp level.

Pre-boost circuit 186 includes an N channel MOS transistor 164 which receives first internal control signal HOUT at its gate, an inverter 184 which inverts received first internal control signal HOUT, and an N channel MOS transistor 166 which receives the output of inverter 184 at its gate.

The sources of N channel MOS transistors 164 and 166 are both coupled to ground potential Vss.

Pre-boost circuit 186 includes a P channel MOS transistor 160 coupled between external power supply node Vdd and the drain of N channel MOS transistor 164 to receive the potential of the drain of N channel MOS transistor 166 at its gate, and a P channel MOS transistor 162 coupled between external power supply potential Vdd and the drain of N channel MOS transistor 166 to receive the drain of N channel MOS transistor 164 at its gate.

The drain of N channel MOS transistor 166 outputs a signal CLK 2 which is in phase with first internal control signal HOUT and the "H" level of which corresponds to the level of external power supply potential Vdd.

Meanwhile, the drain of N channel MOS transistor 164 outputs a signal CLK1 which is in opposite phase with first internal control signal HOUT and has an "H" level corresponding to external power supply potential Vdd.

Pre-boost circuit 186 further includes an N channel MOS transistor 170 coupled between the output of pre-boost circuit 186, i.e., the potential of node N1 and ground potential Vss to receive signal CLK1 at its gate, a P channel MOS transistor 168 coupled between internal boosted potential Vpp and the potential of node N1 to receive signal CLK3 at its gate, and N channel MOS transistors 172 and 174 coupled in series between external power supply potential Vdd and the potential of node N1 to receive at their gates internal boosted potential Vpp and signal CLK2, respectively.

Figure 11:
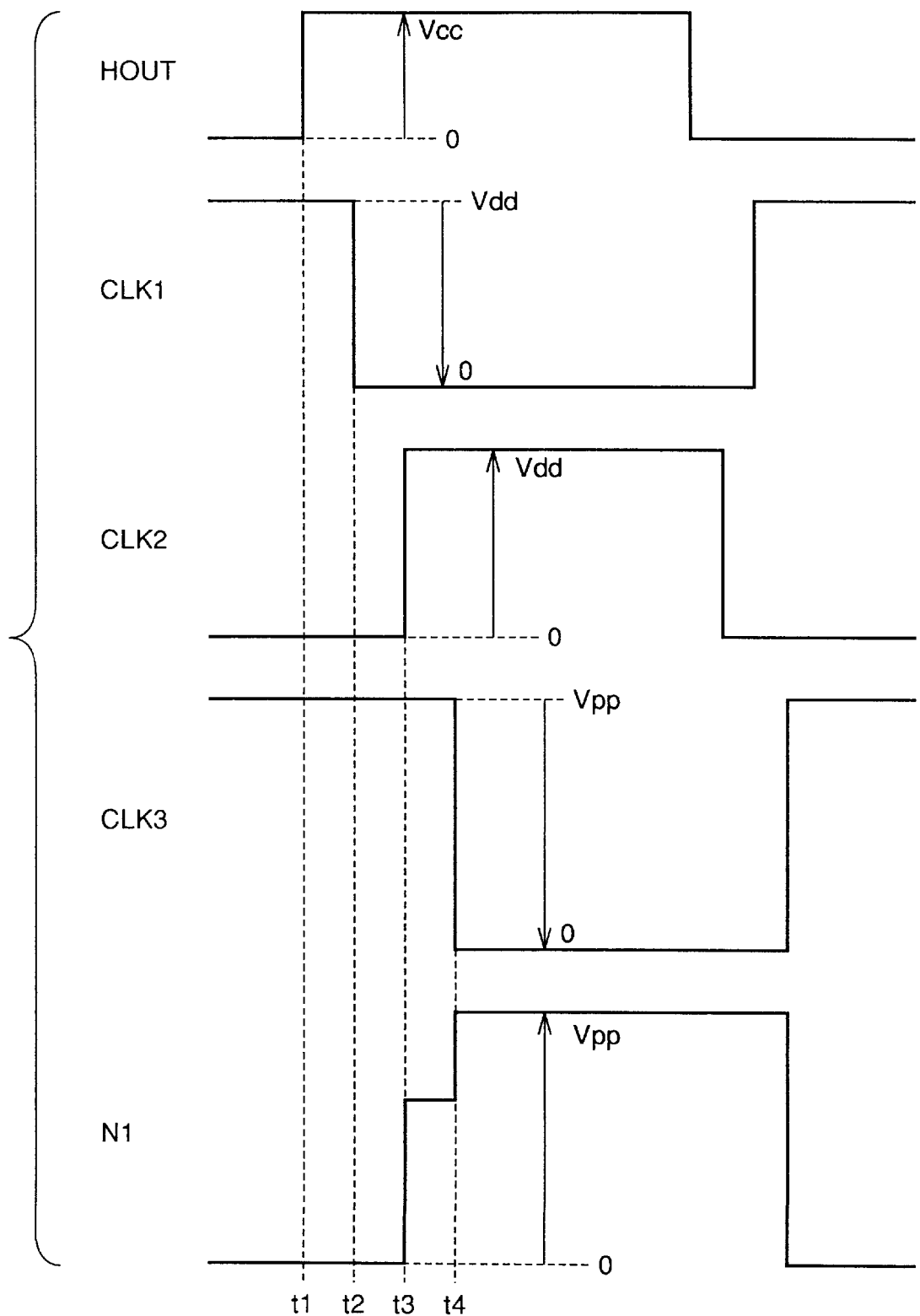
FIG. 11 is an operation waveform chart for use in illustration of the operation of output buffer circuit 3000 in FIG. 10.

FIG. 11 is an operation waveform chart for use in illustration of the operation of pre-boost circuit 186 included in buffer circuit 3000 shown in FIG. 10.

Referring to FIG. 11, at time t1, in response to a rising of internal control signal HOUT from "L" to "H", N channel MOS transistor 164 conducts, and signal CLK1 falls from "H" to "L" at time t2 accordingly.

At the time, N channel MOS transistor 170 attains a non-conductive state, and node N1 is cut off from ground potential Vss.

N channel MOS transistor 166 then attains a non-conductive state, P channel MOS transistor 162 conducts, P channel MOS transistor 160 attains a non-conductive state, and therefore signal CLK2 rises from "L" to "H" at time t3. N channel MOS transistor 174 conducts accordingly, and therefore the potential of node N1 rises.

N channel MOS transistor 172 receives internal boosted potential Vpp at its gate and couples external power supply potential Vdd and the drain of N channel MOS transistor 174, and therefore the potential of node N1 is pulled to a level close to external power supply potential Vdd at time t3. The potential is, however, not high enough to drive output transistor 176.

At time t4, in response to operations of level changing circuit 188 and inverter 182, signal CLK3 falls from "H" to "L". P channel MOS transistor 168 conducts accordingly, and the potential of node N1 is further raised to internal boosted potential Vpp.

As described above, at the time of raising the potential of node N1, node N1 is previously supplied with current from the external power supply through N channel MOS transistors 172 and 174, until the potential of node N1 attains a prescribed potential level, and then current is supplied to node N1 from the boost power supply to provide internal boosted potential Vpp through P channel MOS transistor 168, and therefore current consumption from the boost power supply potential providing internal boosted potential Vpp can be reduced.

In a circuit simulation conducted by the inventors, it was found that charges supplied from the boost power supply to provide internal boosted potential Vpp at a single rising of node N1 were reduced from 3.8 pC to 3.0 pC by applying the circuit of the present invention, and that current consumption could be effectively reduced by about 21%. The effect could be expected for output buffer circuits corresponding to all the output terminals, current consumption by a circuit which generates boosted potential Vpp may be significantly reduced in the entire semiconductor memory device, which can contribute to downsizing of the charge pump circuit to generate internal boosted potential Vpp.

Furthermore, in pre-boost circuit 186, current supplied from the external power supply to node N1 is limited if by any chance boosted potential Vpp becomes lower than external power supply potential Vdd by the function of N channel MOS transistor 172, the operation of the semiconductor memory device according to the second embodiment is highly reliable.

Third Embodiment

Figure 12:
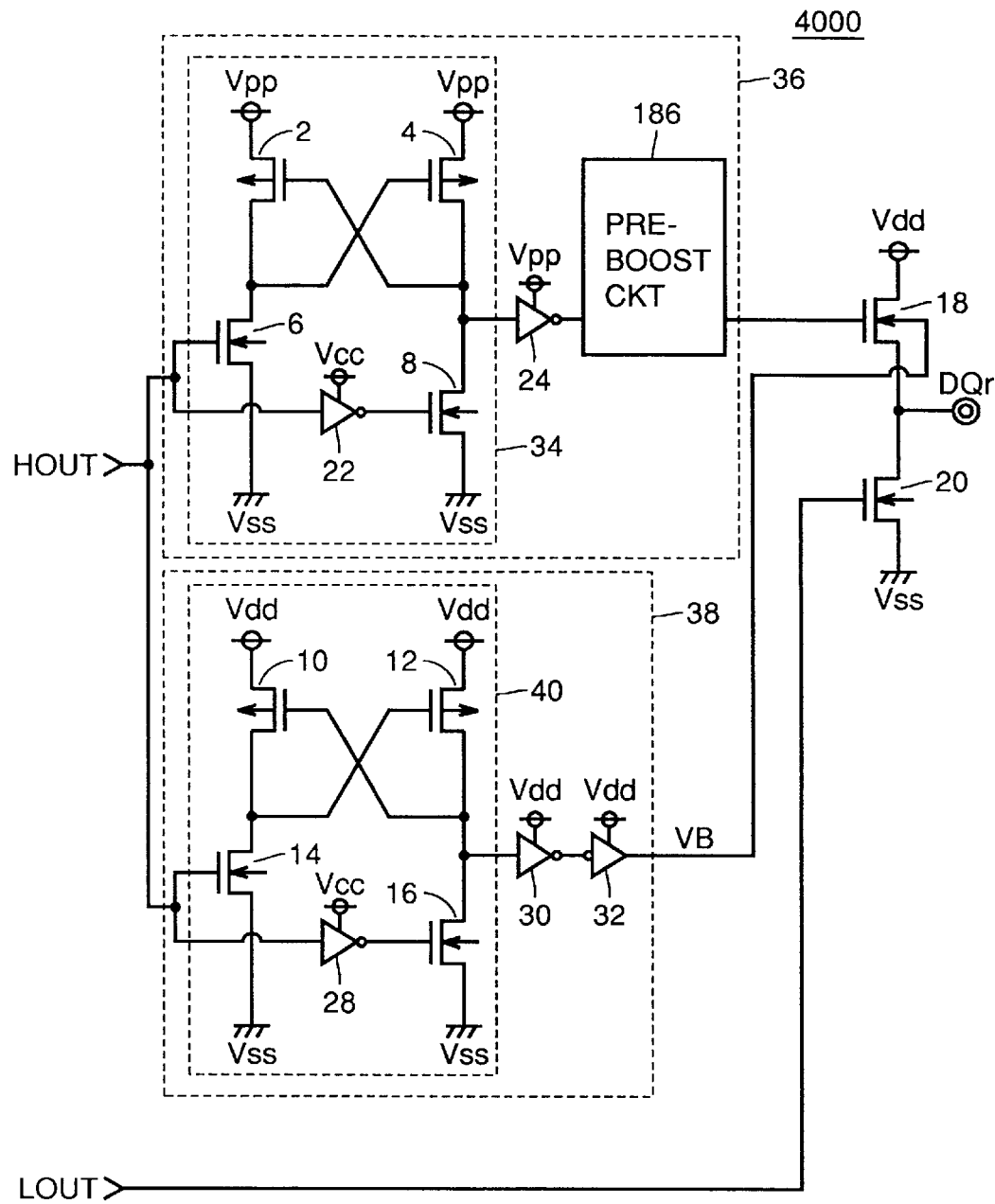
FIG. 12 is a circuit diagram of an output buffer circuit 4000 according to a third embodiment of the invention.

FIG. 12 is a circuit diagram showing the basic configuration of an output buffer circuit 4000 used in a semiconductor memory device according to a third embodiment of the invention.

The general configuration of the semiconductor memory device according to the third embodiment is substantially identical to the general configuration of the semiconductor memory device according to the first embodiment and an output buffer circuit 4000 is provided corresponding to 1 bit in data output buffer 1042 in FIG. 1, and receives, as input signals, first and second internal signals HOUT and LOUT complementary to each other, generated based on a control signal from clock generation circuit 1022 and read data from input/output control circuit 1038, as is the case with the first embodiment.

Output buffer circuit 4000 shown in FIG. 12 is different from the output buffer circuit according to the first embodiment shown in FIG. 3 in that pre-boost circuit 186 according to the second embodiment is provided in place of inverter 26 which applies the gate voltage of N channel MOS transistor 18 serving as an output transistor.

Referring to FIG. 12, output buffer circuit 4000 includes an output terminal DQr, an N channel MOS transistor 18 coupled between external power supply potential Vdd and output terminal DQr, an N channel MOS transistor 20 coupled between ground potential Vss and output terminal DQr to receive second internal control signal LOUT at its gate, a driving circuit 36 which receives first internal control signal HOUT to output a signal VG to drive the gate of N channel MOS transistor 18, and a substrate potential driving circuit 38 which receives first internal control signal HOUT to output a signal VB to drive the substrate portion of N channel MOS transistor 18.

Driving circuit 36 includes a level changing circuit 34 which changes the "H" level of first internal control signal HOUT from the level of internal lowered potential Vcc to internal boosted potential Vpp, an inverter 24 which inverts the received output of level changing circuit 34, and a pre-boost circuit 186 which receives the output of inverter 24 and drives the gate of N channel MOS transistor 18.

The configurations of level changing circuit 34 and substrate potential driving circuit 38 are identical to those of the first embodiment, and therefore the description will not be repeated here.

Thus, the effects of both the first and second embodiments may be brought about at the same time, the substrate biasing effect can be reduced, and internal boosted potential Vpp may be restricted from increasing, while yet sufficient current can be supplied from the output terminal, and current consumed by the charge pump circuit which generates internal boosted potential Vpp may be reduced.

Fourth Embodiment

Figure 13:
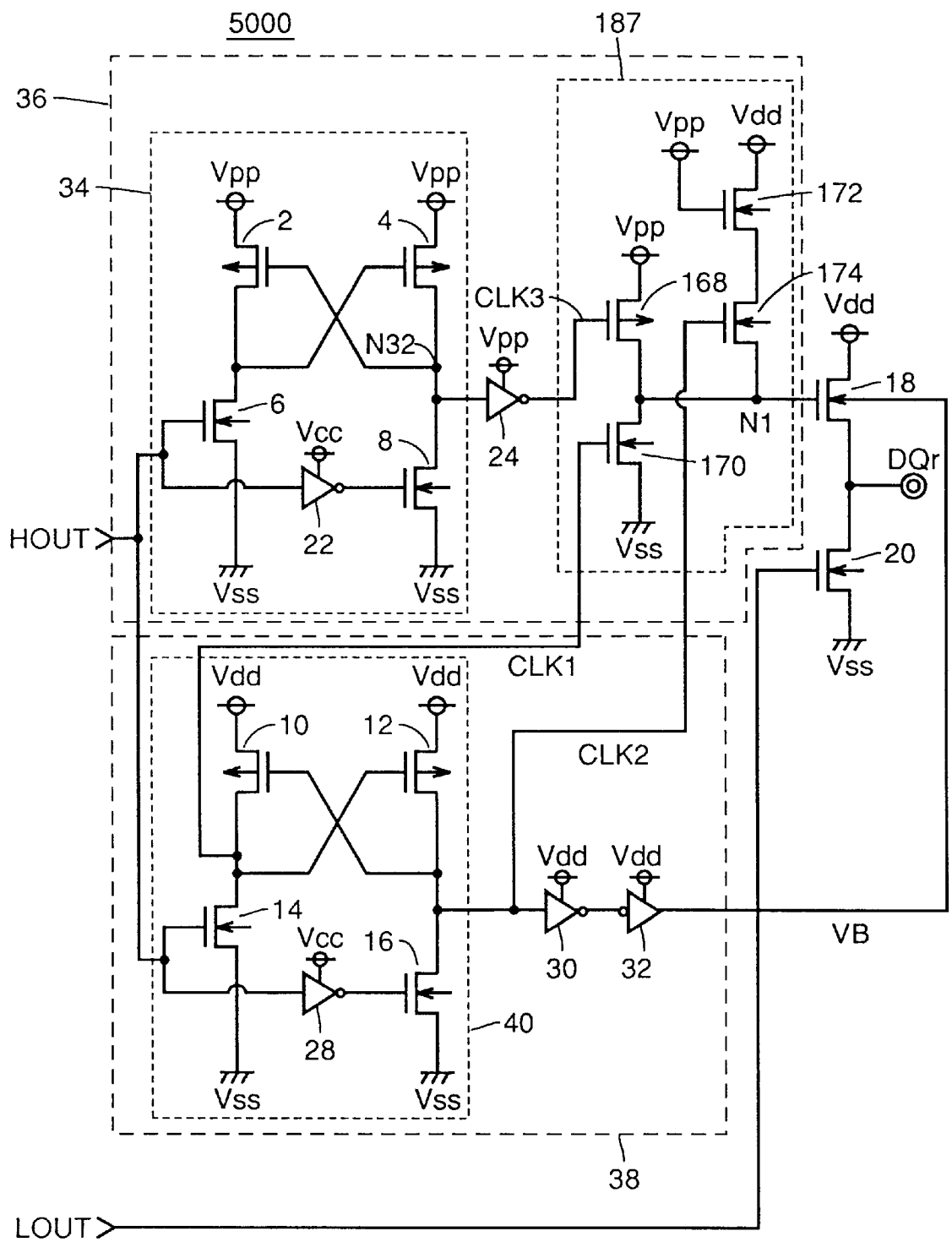
FIG. 13 is a circuit diagram of an output buffer circuit 5000 according to a fourth embodiment of the invention.

FIG. 13 is a circuit diagram showing the basic configuration of an output buffer circuit 5000 used in a semiconductor memory device according to a fourth embodiment of the invention.

The general configuration of the semiconductor memory device according to the fourth embodiment is identical to that of the semiconductor memory device according to the first embodiment, and output buffer circuit 5000 is provided corresponding to 1 bit in data output buffer 1024 in FIG. 1, and receives, as input signals, a first internal signal HOUT and a second internal signal LOUT complementary to each other, generated based on a control signal from clock generation circuit 1022 and read data from input/output control circuit 1038, as is the case with the first embodiment.

In output buffer circuit 5000 shown in FIG. 13, a pre-boost circuit 187 is provided in place of inverter 26 which supplies the gate voltage of N channel MOS transistor 18 serving as an output transistor in the output buffer circuit according to the first embodiment shown in FIG. 3. In addition, in output buffer circuit 5000, pre-boost circuit 187 uses the output signal of level changing circuit 40 included in substrate potential driving circuit 38. Thus, a number of elements is reduced as compared to output buffer circuit 4000 according to the third embodiment.

Referring to FIG. 13, output buffer circuit 5000 includes an output terminal DQr, an N channel MOS transistor 18 coupled between an external power supply potential Vdd and output terminal DQr, an N channel MOS transistor 20 coupled between a ground potential Vss and output terminal DQr to receive second internal control signal LOUT at its gate, a driving circuit 36 which receives first internal control signal HOUT and drives the potential of the gate of N channel MOS transistor 18, and a substrate potential driving circuit 38 which receives first internal control signal HOUT and drives the potential of the substrate portion of N channel MOS transistor 18.

Substrate potential driving circuit 38 includes level changing circuit 40 which changes the "H" level of first internal control signal HOUT from the level of internal lowered potential Vcc to the level of external power supply potential Vdd, and inverters 30 and 32 connected in series to receive the output of level changing circuit 40. Driving circuit 36 includes a level changing circuit 34 which changes the "H" level of first internal control signal HOUT from internal lowered potential Vcc to the level of internal boosted potential Vpp, an inverter 24 which receives the output of level changing circuit 34, and a pre-boost circuit 187 which receives the output of inverter 24 and the output of level changing circuit 40 to drive the gate of N channel MOS transistor 18.

More specifically, signal CLK2, i.e., the output of level changing circuit 40 in phase with first internal control signal HOUT is received by inverter 30 in substrate driving circuit 38 and by the gate of N channel MOS transistor 174 in pre-boost circuit 187. Furthermore, the output signal CLK1 of level changing circuit 40 in opposite phase with first internal control signal HOUT is received by the gate of N channel MOS transistor 170 in pre-boost circuit 187.

Detailed configurations of level changing circuits 34 and 40 and substrate potential driving circuit 38 are the same as those of the first embodiment, and the configurations of MOS transistors 168 to 174 included in pre-boost circuit 187 are the same as those in pre-boost circuit 186 according to the second embodiment, and their description will not be repeated here.

In the configuration as shown in FIG. 13, since the effects of both first and second embodiments may be provided at the same time, the substrate biasing effect may be reduced, internal boosted potential Vpp can be restricted from increasing, yet sufficient current can be supplied, and current consumed by the charge pump circuit which generates internal boosted potential Vpp may be reduced.

Furthermore, since the number of elements is reduced as compared to the third embodiment, the chip size of the semiconductor memory device may be reduced as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate, comprising:

an output terminal;

a first MOS transistor supplying current from an external power supply to said output terminal;

first driving means responsive to activation of a first internal control signal for driving the gate potential of said first MOS transistor to render said first MOS transistor conductive; and second driving means for setting the potential of a substrate portion of said first MOS transistor at a first potential level while said first internal control signal is inactive and driving the potential of said substrate portion to a second potential level so as to boost an output current of said first MOS transistor responsive to the activiation of said first internal control signal.

2. The semiconductor memory device as recited in claim 1, further comprising:

a power supply interconnection directly connected to said external power supply; and an output interconnection directly connected to said output terminal, said first MOS transistor connecting said output interconnection to said power supply interconnection when said first MOS transistor is in a conductive state.

3. The semiconductor memory device as recited in claim 1, wherein said second driving means drives the potential of the substrate portion of said first MOS transistor so that the potential difference between the substrate and source of said first MOS transistor is a prescribed potential difference, when said first MOS transistor is in a non-conductive state, and drives the potential of the substrate portion of said first MOS transistor so that the potential difference between the substrate and the source of said first MOS transistor is smaller than said prescribed potential difference, when said first MOS transistor is in a conductive state.

4. The semiconductor memory device as recited in claim 3, further comprising boosting means for generating a boosted potential higher than the potential of said external power supply, wherein said first driving means includes level converting means for changing a high potential level of said first internal control signal to the level of said boosted potential which is a high potential level applied to the gate of said first MOS transistor.

5. The semiconductor memory device as recited in claim 3, wherein said second driving means receives current supplied from said external power supply to drive the potential of the substrate portion of said first MOS transistor, said semiconductor device further comprising rectifying means, provided between said output terminal and said substrate portion of said first MOS transistor, for receiving current supplied by said second driving means to said substrate portion in response to an activation of the first internal control signal, and for driving the potential level of said output terminal independently of said first MOS transistor.

6. The semiconductor memory device as recited in claim 3, further comprising first switching means coupled between said output terminal and a ground node for driving the potential of said output terminal in response to second internal control signal.

7. The semiconductor memory device as recited in claim 3, further comprising boosting means for generating a boosted potential higher than the potential of said external power supply, wherein said second driving means includes, first level converting means for changing a high potential level of said first internal control signal to the level of said external power supply potential, and substrate portion driving means receiving the output of said first level changing means for driving the potential of the substrate portion of said first MOS transistor, said first driving means includes, second level changing means for changing the high potential level of said first internal control signal to the level of said boosted potential, delay means for receiving and delaying the output of said second level changing means, and pre-boost means receiving the output of said delay means for driving the gate potential of said first MOS transistor, and said pre-boost means includes, a second MOS transistor supplied with current from said boosting means for supplying current to the gate of said first MOS transistor in response to the output of said delay means, current limiting means receiving current input from said external power supply for limiting current to output to the level of a prescribed current value or lower during the period in which said boosted potential is not raised to a prescribed level, and a third MOS transistor supplied with current from said external power supply through said current limiting means for supplying current to the gate of said first MOS transistor based on the output of said first level changing means.

8. The semiconductor memory device as recited in claim 6, wherein said first switching means includes a second MOS transistor, said first MOS transistor is provided in a first well region of first type conductivity formed on a main surface of said semiconductor substrate and is of second type conductivity, said second MOS transistor is provided in a second well region of said first type conductivity formed on the main surface of said semiconductor substrate and is of said second type conductivity, said first well region is electrically isolated from said second well region, and said second driving means drives the potential of said first well region when said first MOS transistor is conductive.

9. The semiconductor memory device as recited in claim 8, wherein said first type conductivity is P type conductivity, and said second type conductivity is N type conductivity.

10. The semiconductor memory device as recited in claim 8, further comprising a third well region of said second type conductivity, wherein said semiconductor substrate is of said first type conductivity, said first well region is provided in said third well region, and said third well region is fixed at the level of a prescribed potential in order to electrically isolate said first well region from said second well region.

11. The semiconductor memory device as recited in claim 8, further comprising a third well region of said second type conductivity, wherein said semiconductor substrate is of said first type conductivity, said first well region is provided in said third well region, and said third well region is electrically connected with said first well region.

12. The semiconductor memory device as recited in claim 8, wherein said semiconductor substrate is of said second type conductivity.

13. The semiconductor memory device as recited in claim 8, wherein said first driving means includes second switching means for supplying current to the gate of said first MOS transistor in response to said first internal control signal, third switching means for supplying current to the gate of said first MOS transistor in response to said first internal control signal, and current limiting means for limiting charging current supplied to the gate of said first MOS transistor from said external power supply, said second switching means is supplied with current from said boosting means, said third switching means is supplied with current from said external power supply through said current limiting means, and said current limiting means limits said charging current during the period in which said boosted potential is not raised to a prescribed potential level.

14. The semiconductor memory device as recited in claim 13, wherein said current limiting means includes a second MOS transistor which receives said boosted potential at its gate and current from said external power supply to supply current to the gate of said first MOS transistor.

15. A semiconductor memory device, comprising:

an output terminal;

boosting means for generating a boosted potential higher than an external power supply potential;

a first MOS transistor for supplying current from said external power supply to said output terminal in response to a first internal control signal;

first switching means for supplying current to the gate of said first MOS transistor in response to said first internal control signal;

second switching means for supplying current to the gate of said first MOS transistor in response to said first internal control signal; and current limiting means for limiting charging current supplied to the gate of said first MOS transistor from said external power supply, wherein said first switching means is supplied with current from said boosting means, said second switching means is supplied with current from said external power supply through said current limiting means, and said current limiting means limits said charging current during the period in which said boosted potential is not raised to a prescribed potential level.

16. The semiconductor memory device as recited in claim 15, wherein said current limiting means includes a second MOS transistor which receives said boosted potential at its gate and current from said external power supply to supply current to the gate of said first MOS transistor.

17. The semiconductor memory device as recited in claim 15, further comprising third switching means coupled between said output terminal and a ground node for driving the potential of said output terminal in response to a second internal control signal.

* * * * *